(12) United States Patent
Nyhart, Jr. et al.

(10) Patent No.: US 7,164,839 B2
(45) Date of Patent: Jan. 16, 2007

(54) ELECTROMAGNETIC RADIATION COLLECTOR AND TRANSPORT SYSTEM

(75) Inventors: Eldon H. Nyhart, Jr., Zionsville, IN (US); William S. Meyers, Fishers, IN (US)

(73) Assignee: Biosynergetics, Inc., Zionsville, IN (US)

( * ) Notice: Subject to any disclaimer, the term of this patent is extended or adjusted under 35 U.S.C. 154(b) by 0 days.

(21) Appl. No.: 11/215,789

(22) Filed: Aug. 30, 2005

(65) Prior Publication Data

US 2006/0054164 A1 Mar. 16, 2006

Related U.S. Application Data

(62) Division of application No. 10/369,052, filed on Feb. 18, 2003, now Pat. No. 6,957,650.

(60) Provisional application No. 60/357,705, filed on Feb. 15, 2002.

(51) Int. Cl.
*G02B 6/10* (2006.01)
*F24J 2/18* (2006.01)

(52) U.S. Cl. .................. 385/131; 385/133; 126/685

(58) Field of Classification Search ............... 385/131, 385/133

See application file for complete search history.

(56) References Cited

U.S. PATENT DOCUMENTS

| | | | |
|---|---|---|---|
| 3,674,336 A | 7/1972 | Kogelnik |
| 3,977,763 A | 8/1976 | Ostrowsky et al. |
| 4,006,963 A | 2/1977 | Baues et al. |
| 4,168,107 A | 9/1979 | Sauter |
| 4,173,390 A | 11/1979 | Kach |
| 4,329,535 A | 5/1982 | Rapp |
| 4,379,613 A | 4/1983 | Coburn |

(Continued)

FOREIGN PATENT DOCUMENTS

WO   WO 99/04296   1/1999

(Continued)

OTHER PUBLICATIONS

"Lighting—New Technology, New Techniques" by Timothy Fohl, Edward R. Freniere, and Jeffrey T. Remillard; *Optics & Photonics News* Aug. 2001; four pages.

(Continued)

*Primary Examiner*—Sung Pak
*Assistant Examiner*—Eric Wong
(74) *Attorney, Agent, or Firm*—Bose McKinney & Evans LLP

(57) ABSTRACT

The present invention includes a radiation collector configured to collect incident radiation. The radiation collector includes a radiation directing component configured to redirect the incident radiation, a buffer component configured to receive the radiation redirected by the radiation directing component, and a propagation component configured to receive the radiation from the buffer component and to propagate the radiation towards a first end of the propagation component.

14 Claims, 14 Drawing Sheets

U.S. PATENT DOCUMENTS

| | | | |
|---|---|---|---|
| 4,505,264 | A | 3/1985 | Tremblay |
| 4,511,209 | A | 4/1985 | Skutnik |
| 4,711,512 | A | 12/1987 | Upatnieks |
| 4,747,654 | A | 5/1988 | Yi-Yan |
| 4,765,706 | A | 8/1988 | Marcatili et al. |
| 4,781,428 | A | 11/1988 | Epworth et al. |
| 4,863,224 | A | 9/1989 | Afian et al. |
| 5,259,208 | A | 11/1993 | Mizuno |
| 5,268,985 | A | 12/1993 | Ando et al. |
| 5,271,078 | A | 12/1993 | Franz et al. |
| 5,295,208 | A | 3/1994 | Caulfield et al. |
| 5,418,631 | A | 5/1995 | Tedesco |
| 5,465,311 | A | 11/1995 | Caulfield et al. |
| 5,497,762 | A | 3/1996 | Rylewski |
| 5,500,054 | A | 3/1996 | Goldstein |
| 5,515,184 | A | 5/1996 | Caulfield et al. |
| 5,515,462 | A | 5/1996 | Huang et al. |
| 5,575,860 | A | 11/1996 | Cherney |
| 5,581,447 | A | 12/1996 | Raasakka |
| 5,597,421 | A | 1/1997 | Regan et al. |
| 5,716,442 | A | 2/1998 | Fertig |
| 5,745,266 | A | 4/1998 | Smith |
| 5,772,792 | A | 6/1998 | Zimmermann |
| 5,782,993 | A | 7/1998 | Ponewash |
| 5,818,986 | A | 10/1998 | Asawa et al. |
| 5,851,309 | A | 12/1998 | Kousa |
| 5,854,697 | A | 12/1998 | Caulfield et al. |
| 5,877,874 | A | 3/1999 | Rosenberg |
| 5,879,472 | A | 3/1999 | Ronwin |
| 6,005,692 | A | 12/1999 | Stahl |
| 6,015,950 | A | 1/2000 | Converse |
| 6,021,007 | A | 2/2000 | Murtha |
| 6,037,535 | A | 3/2000 | Yoshino |
| 6,043,425 | A | 3/2000 | Assad |
| 6,087,579 | A | 7/2000 | Muskatevc |
| 6,091,017 | A | 7/2000 | Stem |
| 6,103,969 | A | 8/2000 | Bussey |
| 6,169,613 | B1 | 1/2001 | Amitai et al. |
| 6,185,015 | B1 | 2/2001 | Reinhorn et al. |
| 6,216,480 | B1 | 4/2001 | Camus et al. |
| 6,269,203 | B1 | 7/2001 | Davies et al. |
| 6,274,860 | B1 | 8/2001 | Rosenberg |
| 6,285,816 | B1 | 9/2001 | Anderson et al. |
| 6,304,703 | B1 | 10/2001 | Lowry |
| 6,307,144 | B1 | 10/2001 | Mimura et al. |
| 6,324,329 | B1 | 11/2001 | Mizuno |
| 6,324,330 | B1 * | 11/2001 | Stites .......................... 385/133 |
| 2001/0010222 | A1 | 8/2001 | Prueitt |
| 2001/0017154 | A1 | 8/2001 | Washio |
| 2003/0007763 | A1 | 1/2003 | Bazylenko et al. |
| 2003/0016907 | A1 | 1/2003 | LoCascio et al. |
| 2003/0031438 | A1 | 2/2003 | Kambe et al. |
| 2003/0063884 | A1 | 4/2003 | Smith et al. |

FOREIGN PATENT DOCUMENTS

| | | |
|---|---|---|
| WO | WO 00/74147 | 12/2000 |

OTHER PUBLICATIONS

"15.3: Volume Holographic Components for Display Applications" by T. John Trout, William J. Gambogi. Kirk W. Steijn, and Steven R. Mackara of DuPont Holographics, Wilmington, Delaware, SID 00 Digest; four pages.

Lens Arrays from Reflexite Display Optics products website; copyright 2001; two pages.

"Large Aperture Scanning Lidar based on Holographic Optical Elements" by Geary Schwimmer, David O. Miller, Thomas D. Wilerson, Ionio Andrus, and Davis V. Guerra; three pages.

"Fundamental of Photonics" by Bahaa E. A. Saleh and Malvin Carl Teich; published by Wiley-Interscience; ten pages.

Information on the Glenn Research Center from NASA's website at http://www.nasatech.com/Spinoff/spinoff2001/glenn.html; three pages.

Pages 14-25 of 56 pages from "Chapter 3: History of Modern Concentrators" from Crating/IES/BOOK1/0200 Draft 2/ May 20, 2001.

"Next Generation Solar Array Technologies for Small Satellites" by E. Fosness, J. Guerrero, C. Mayberry, B. Carpenter, and D. Goldstein from 16th Annual/USU Conference on Small Satellites; ten pages.

"Fiber Optic Technical Training Manual" from Agilent Technologies; 65 pages; copyright 2000.

Abstract of "Design and fabrication of a holographic solar concentrator" by Tae Youn Hur, Hee Dong Kim, and Man Ho Jeong; 1 page, 2000.

Abstract of "The optimization of a holographic system for solar power generation" by JE Ludman, J. Riccobono, IV Semenova, No. Reinhand, W. Tai, Li Xaoli, G. Syphers, G. Sliker, and J. Martin: 1 page, 1997.

Abstract of "Holographic solar concentrator for terrestrial photovoltaics" by J. Ludman, J. Riccobono, N. Reinhand, I. Semenova, J. Martin, W. Tai, Li Xiao-Li, and G. Syphers: 1 page, 1994.

Abstract of "Holographic solar concentrator" JL Hull, JP Lauer, DC Broadbent; 1 page, 1987.

Abstract for "Development of high efficiency holographic solar concentrator" by W. Windeln and CG Strojanoff; 1 page, 1985.

Abstract for "Holographic solar concentrator" by JE Ludman, 1 page, 1982.

Abstract for "High-concentration collection and remote delivery of sunlight with fiber-optic mini-dishes" by D. Feuermann and JM Gordon; 1 page, 1999.

Abstract for "Solar fiber-optic mini-dishes: a new approach to the efficient collection of sunlight" by D. Feuermann and JM Gordon; 1 page, 1999.

Abstract for "200 W solar energy delivery with optical fiber bundles" by Liang Dawei, Y. Nunes, L. Fraser Monteiro, ML Fraser Monteiro, and M. Collares-Pereira; 1 page, 1997.

Abstract for "Theoretical analysis of textured thin-film solar cells and a guideline to achieving higher efficiency" by T. Sawada, H. Tarui, N. Terada, M. Tanaka, T. Takahama, S. Tsuda, and S. Nakano; 1 page, 1993.

Abstract for "Study on solar energy concentrating system" by O. Toshiharu, W. Kouichirou, Y. Hiroo, and N. Hitoshi; 1 page, 1998.

Abstract for "Highly concentrated solar energy transmission through an optical fiber coupled with CPC" by H. Arashi, H. Naito, H. Yugami, and T. Oka; 1 page, 1997.

Abstract for "Optimization procedure for a holographic lens solar concentrator" by CG Stojanoff, R. Kubitzek, and S. Tropartz; 1 page, 1989.

Abstract for "Design and optimization of a holographic concentrator for two-color PV-operation" by E. U. Wagemann, K. Frochlich, J. Schulat, H. Schuette, and C. G. Stojanoff; 1 page, 1993.

Abstract for "Fabrication of large format holograms in dischromated gelatin films for sun control and solar concentrators" by Christo G. Stojanoff, Hartmut Schulat, Jochen Schulat, Ralf Kubiza, and Philipp Froening; 1 page, 1997.

Abstract for "Fiber-optic solar energy transmission and concentration" by Liang Dawei, L. Fraser Monteiro, M. Ribau Teixeira, M.L. Fraser Monteiro, and M. Collares-Pereira; 1 page, 1998.

Abstract for "Exacting concentrated guided light" by Harald Ries, Akiba Segal, and Jacob Karni; 1 page, 1997.

Abstract for "Development of a holographic beamsplitter for use with a conventional Fresnel lens" by Hughes Aircraft Co.; 1 page, 1987.

Abstract for "Chromatic dispersion compensation in a Fresnel lens by means of a diffraction grating" by Kenneth C. Johnson; 1 page, 1989.

Abstract for "Development of a high efficiency holographic solar concentrator" by Wilbert Windeln and Christo G. Stojanoff; 1 page, 1985.

Abstract for "Using fiber optics to tap the sun's power" by Noor Khatri, Max Brown, and Frank Gerner; 1 page, 1993.

Abstract for "High efficiency collectors for solar energy applications: analysis and preliminary experimental results" by Antonello Cutolo, Donato Curtotti, Mario Pirro, Ivo Rendina, andFrancesco Reale; 1 page, 1989.

Abstract for "Durability of porous silica antireflection coatings for solar collector cover plates" by KJ Cathro, DC Constable, and T. Solaga; 1 page, 1981.

Abstract for "Design and perfomance analysis of plano-cylindrical Fresnel lens" by RS Sirohi; 1 page, 1979.

Abstract for "Light leakage in optical fibers: experimental results, modeling, and the consequences for remote lighting and solar concentrator systems" by D. Feuermann, JM Gordon, and M. Huleihal; 1 page, 2001.

"Holographic Memory" by John Sand; five pages.

* cited by examiner

ELECTROMAGNETIC RADIATION COLLECTOR AND TRANSPORT SYSTEM

REFERENCE TO RELATED APPLICATIONS

The present application is a divisional of U.S. patent application Ser. No. 10/369,052, filed Feb. 18, 2003 now U.S. Pat. No. 6,957,650, the complete disclosure of which is hereby expressly incorporated herein by reference. This patent application also claims the benefit of U.S. Provisional Application No. 60/357,705, filed on Feb. 15, 2002, the disclosure of which is hereby expressly incorporated by reference.

BACKGROUND AND SUMMARY OF THE INVENTION

The present invention relates to collectors configured to collect electromagnetic radiation and in particular, collectors configured to collect solar radiation and further relates to optical connectors for coupling radiation from a first optical component to a second optical component.

Solar energy collectors have used holographic elements to alter the direction of incident sunlight. Such example solar collectors include U.S. Pat. Nos. 4,863,224; 5,877,874, and 6,274,860. However, each of these systems discuss the need to alter the holographic element at various spatial regions in order to avoid unwanted decoupling of solar energy from the solar collector. Such requirements result in complex systems which are not practical.

In one exemplary embodiment of the present invention includes a radiation collector configured to collect incident radiation. The radiation collector includes a radiation directing component configured to redirect the incident radiation, a buffer component configured to receive the radiation redirected by the radiation directing component, and a propagation component configured to receive the radiation from the buffer component and to propagate the radiation by at least total internal reflection. Other embodiments of the present invention further include connectors for coupling radiation from a first optical component to a second optical component.

In another exemplary embodiment, a collector for collecting radiation incident on the collector from at least a first direction comprises a propagation component configured to transmit radiation and having a first end and at least a first refractive index; a buffer component coupled to the propagation component and configured to transmit radiation and having at least a second refractive index, the second refractive index being less than the first refractive index of the propagation component; and a radiation directing component coupled to the buffer component and configured to redirect the incident radiation from the at least first direction along at least a second direction different than the first direction within the buffer component, such that the radiation enters the propagation component and is propagated within the propagation component toward a first end of the propagation component by at least total internal reflection. In one example, the radiation is solar radiation and the buffer component is positioned relative to the propagation component and the radiation directing component, such that the radiation propagating in the propagation component is prevented from interacting with the radiation directing component.

In yet another exemplary embodiment, a collector for collecting radiation incident on the collector from at least a first direction comprises a radiation directing component configured to redirect the incident radiation; a buffer component coupled to the radiation directing component and configured to receive the radiation redirected by the radiation directing component; and a propagation component coupled to the buffer component and configured to receive the radiation from the buffer component and to propagate the radiation generally in a first direction toward a first end of the propagation component by at least total internal reflection, the radiation directing component being positioned such that the radiation incident on the collector which is received into the propagation component is incident from a direction generally not parallel with the first direction of the propagation component.

In a further exemplary embodiment, a solar collector configured to collect incident solar radiation and to be affixed to a surface of a building comprises an optical component having a top surface and a first end, the optical component configured to receive the incident solar radiation through the top surface and to collect the incident solar radiation at the first end of the optical component; and an attachment component coupled to the optical component, the attachment component configured to receive at least one fastening components to secure the attachment component to the surface of the building.

In one exemplary method, a method of collecting incident radiation comprises the steps of receiving the incident radiation from at least a first direction; redirecting the incident radiation with a radiation directing component into a propagation component; retaining the radiation in the propagation component such that the radiation is propagated generally toward a first end of the propagation component; and optically separating the radiation component from the propagation component such that the radiation propagating with the propagation component is prevented from interacting with the radiation directing component.

In another exemplary method, a method of coupling optical radiation from at least a first source of optical radiation into a first optical transport component including a first propagation component and a first buffer component, the first buffer component radially overlaying the first propagation component and the first optical transport component configured to propagate optical radiation in generally a first direction toward a first end of the first optical transport component or in generally a second direction toward a second end of the first optical transport component comprises the steps of positioning the at least first source of optical radiation adjacent an exterior radial surface of the first buffer component; and directing at least a portion of the radiation emanating from the source of optical radiation into the first buffer component of the first optical transport component such that the radiation is coupled into the first propagation component and is propagated within the first propagation component toward at least one of the first end or the second end of the first propagation component due at least to total internal reflection between the first propagation component and the second component.

In yet a further exemplary embodiment, an optical connector for transferring radiation comprises a first optical transport component including a first propagation component and a first buffer component, the first buffer component radially overlaying the first propagation component, the first optical transport component configured to propagate optical radiation in generally a first direction toward a first end of the first optical transport component; a second optical transport component including a second propagation component and a second buffer component, the second buffer component radially overlaying the second propagation component, the second optical transport component configured to propagate optical radiation in generally a second direction toward a second end of the second optical transport component, the second optical transport component being positioned such that the second direction is not parallel to the first direction; and a radiation directing component located proximate to the first end of the first optical transport component and proximate to an exterior surface of the buffer component of the second optical transport component, the radiation directing component configured to redirect the optical radiation propagating generally in the first direction through the exterior surface of the second optical transport into the second propagation component such that the optical radiation is propagated within second optical transport component generally along the second direction of the second optical transport component.

Additional features of the present invention will become apparent to those skilled in the art upon consideration of the following detailed description of the preferred embodiment exemplifying the best mode of carrying out the invention as presently perceived.

BRIEF DESCRIPTION OF THE DRAWINGS

The detailed description of exemplary embodiments particularly refers to the accompanying figures in which.

DETAILED DESCRIPTION OF EXEMPLARY EMBODIMENTS

Figure 1:
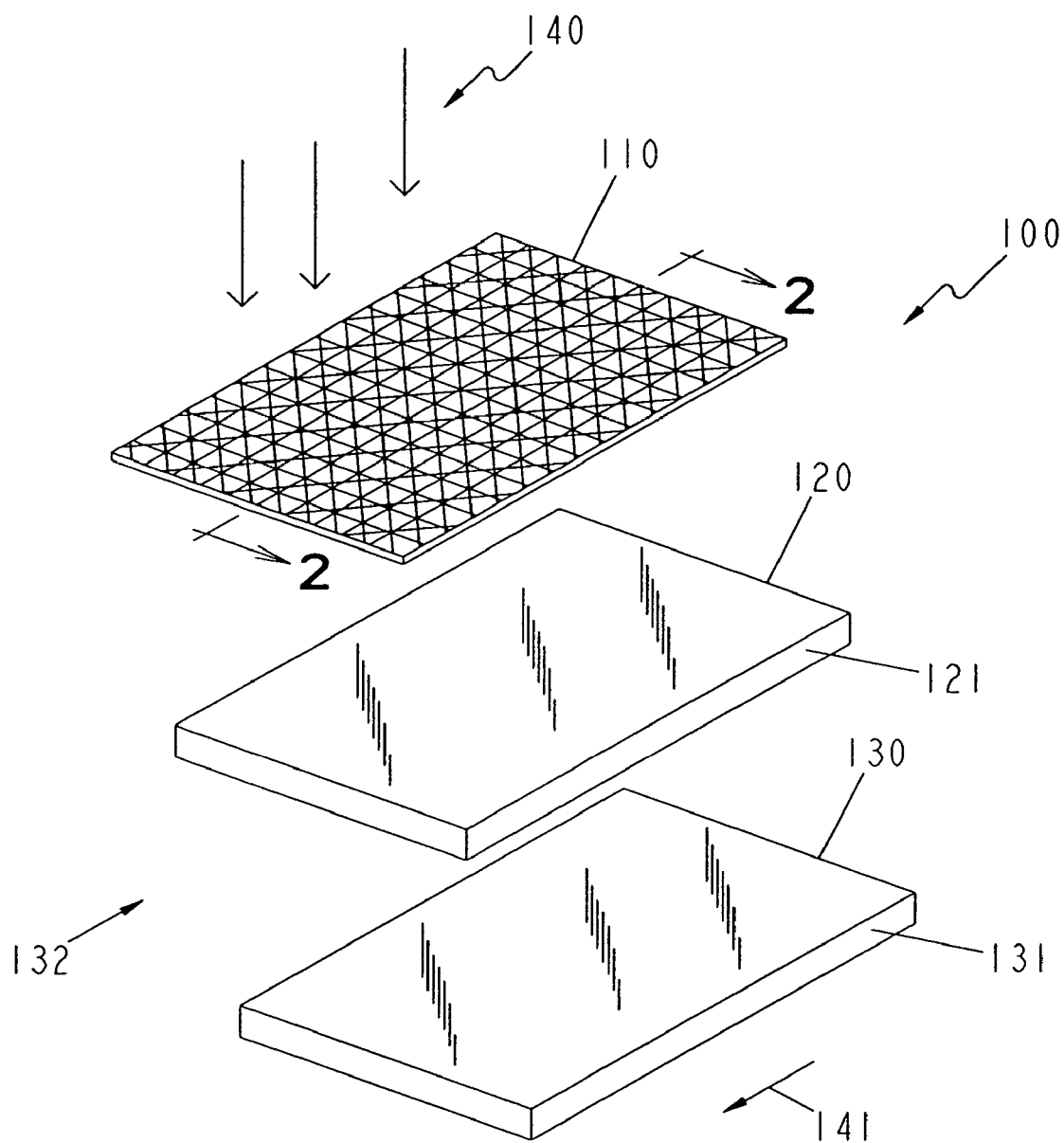
FIG. 1 is an exploded, perspective view of a first embodiment of a solar collector including a radiation directing component, a buffer component, and a propagation component.

While the invention is susceptible to various modifications and alternative forms, exemplary embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Referring to FIG. 1, a first embodiment of a radiation or solar collector 100 is shown. Solar collector 100 includes a radiation or light directing component 110, a buffering component 120, and a propagation component 130. As described in detail below, radiation or light directing component 110 is configured to redirect at least a portion of the incident solar radiation 140 on solar collector 100 into propagation component 130, propagation component 130 is configured to collect the portion of solar radiation redirected by light directing component 110, and buffer component 120 is configured to optically separate light directing component 110 and propagation component 130 and to retain the collected radiation in propagation component 130.

Figure 2:
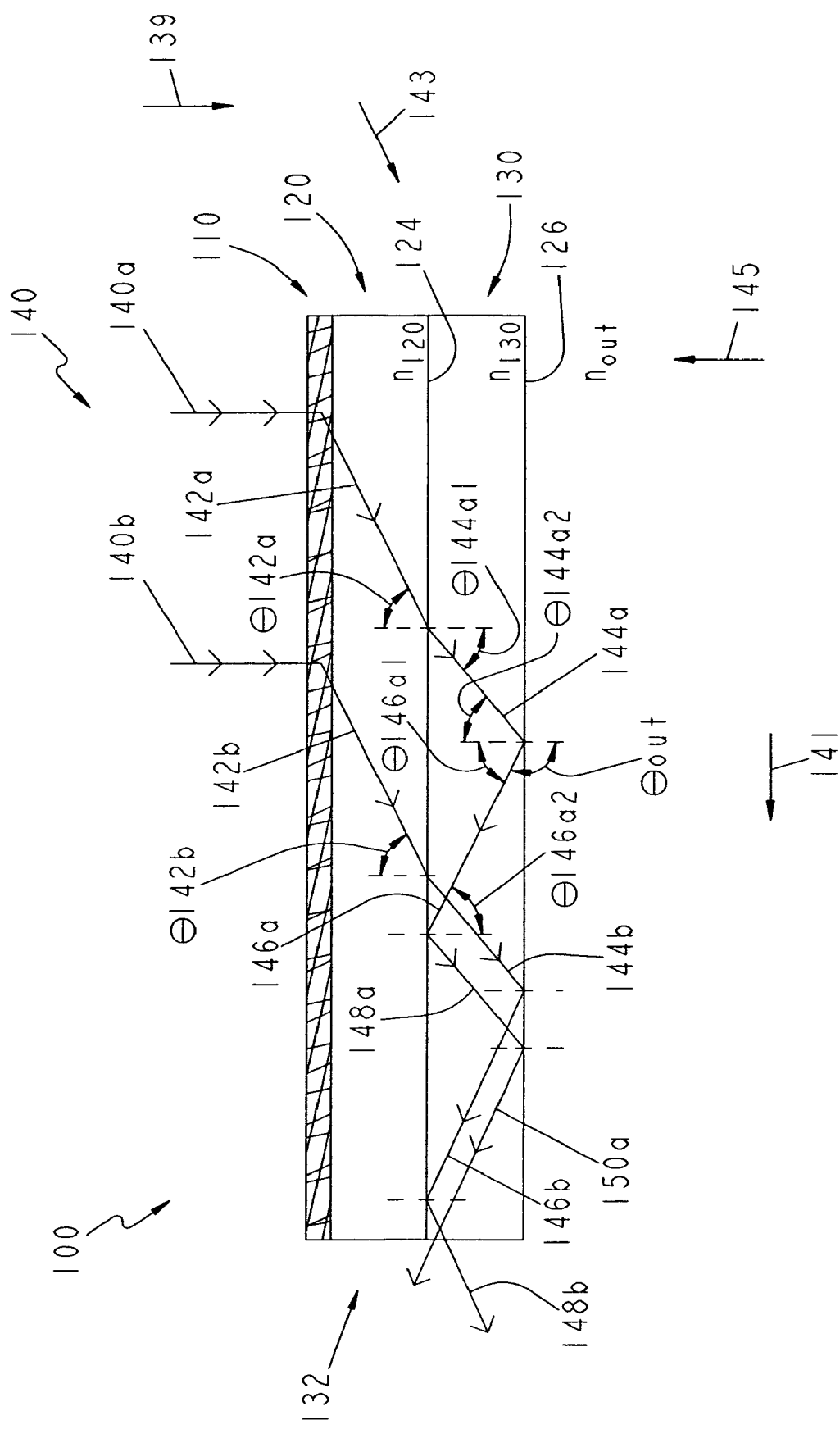
FIG. 2 is a cross-section view of the solar collector of FIG. 1 corresponding to the solar collector in an assembled configuration.

Referring to FIG. 2, a schematic cross-section of an assembled solar collector 100 is shown, along with the interaction of incident solar rays 140a, and 140b with solar collector 100. Rays 140a and 140b are representative of the incident solar radiation. Although light rays 140a and 140b are generally incident on solar collector 100 from a direction 139, it is understood that the incident solar radiation may be from one or more additional directions. In the illustrated embodiment, light directing component 110 and buffer component 120, as well as buffer component 120 and propagation component 130 are coupled together with at least one of a variety of optical adhesives known in the art for coupling optic media. Exemplary optical adhesives include optical epoxies and optical cements. Exemplary optical epoxies include epoxies available from MasterBond, Inc. located at 154 Hobart Street in Hackensack, N.J. 07601 and exemplary cements from Summers Optical located at 321 Morris Road, PO Box 162 in Fort Washington, Pa. 19034. It is preferred to use optical adhesives which are index matching adhesives which have an index of refraction in close approximation to at least one of the components being coupled together. It is preferred to use optical adhesives which are configured for use in applications that are exposed to long durations of solar radiation.

Radiation or light directing component 110 is configured to redirect solar radiation incident from at least a first direction 139, as represented by rays 140a and 140b along at least a second direction 143 into buffer component 120, as represented by rays 142a and 142b. Rays 142a and 142b propagate through buffer component 120 and are incident on propagation component 130 at an angle, $\theta_{142a}$ and $\theta_{142b}$, respectively, with the normal of an interface 124 between buffer component 120 and propagation component 130 such that rays 142a and 142b are refracted into propagation component 130 as light rays 144a and 144b. Light rays 144a and 144b propagate in propagation component 130 generally in a direction 141 toward a first end 132 of solar collector 100. The direction of light rays 142a and 142b, as well as, the properties of buffer component 120 and propagation component 130 are chosen such that light rays 144a and 144b are retained within propagation component 130 at subsequent interactions with interface 124 between buffer component 120 and propagation component 130 and a lower interface 126 between propagation component 130 and the outside medium, such as air. In one example, light rays 144a and 144b are retained within propagation component 130 by substantially total internal reflection. In another example, interface 126 includes a reflection coating (not shown), such as a mirrored surface, and light rays 144a and 144b are retained within propagation component 130 due to being reflected by the reflection coating on interface 126. In another example, light rays 144a and 144b are retained in propagation component 130 due to at least one of total internal reflection and reflection from a reflection coating. In yet a further example, at least one edge surface 121 and 131, of either or both buffer component 120 and propagation component 130 includes a reflection coating to retain solar radiation in buffer component 120 and propagation component 130. However, it should be noted that solar radiation may also be retained in propagation component 130 at surface 131 and buffer component 120 at surface 121 due to total internal reflection.

Light directing component 110, in a first embodiment, includes a holographic element, such as a film hologram or a volume hologram. In a second embodiment, light directing component 110 includes a diffraction grating or ruling. The design of holographic elements and/or diffraction gratings or rulings to redirect light incident from at least a first direction 139, such as the direction of light rays 140a and 140b in FIG. 2, along at least a second direction 143, such as the direction of light rays 142a and 142b is known.

Holographic elements are generally configured to redirect radiation that has a wavelength band approximate in value to the wavelength used to record the holographic element. Since solar radiation includes radiation at many different wavelengths, including the entire visible spectrum, it is preferred to use holographic elements which are configured to redirect incident radiation from multiple wavelength bands along at least the second direction 143. In one example, light directing component 110 contains multiple layered holographic elements, each holographic element being configured to redirect radiation approximate to a different wavelength band. In another example, multiple wavelengths are used in the recording of light directing component 110 in a single film. Light directing component 110 includes a plurality of fringe patterns each created by a recording beam pair having a different recording wavelength such that the resultant light directing component is capable of redirecting radiation from several different wavelengths.

Further, holographic elements are generally configured to redirect radiation that is incident from one of the directions used to record the holographic element, the directions of the recording beam pairs. Since solar radiation is incident on solar collector 100 from directions in addition to first direction 139, it is preferred to use holographic elements which are configured to redirect radiation from multiple incident directions including direction 139 along at least second direction 143 or other directions that allow the radiation to be propagated within the corresponding propagation component 130 by total internal reflection and/or reflection from a reflection coating. In one example, light directing component 110 contains multiple layered holographic elements, each holographic element being configured to redirect radiation from a different given incident direction such that the radiation is propagated in the propagation component by total internal reflection and/or reflection from a reflection coating. In another example, light directing component 110 includes a plurality of fringe patterns in a single film produced by recording a plurality of recording beams pairs each of which interfere to produce a holographic structure which will accept light from a range of input angles and output the light into a different range of angles chosen such that the output light is coupled into the propagation component.

Diffraction gratings and ruling can also be configured to redirect radiation of several wavelength bands and radiation from several incident directions into the propagation component such that the radiation is propagated in the propagation component by total internal reflection and/or reflection from a reflection coating. For example, the spacing of the grating can be varied either along a lateral extent of the grating or by placing gratings having different spacing adjacent each other.

In the illustrated embodiment, buffer component 120 is a refractive media having at least a first index of refraction, denoted as $n_{120}$, propagation component 130 is a refractive media having at least a second index of refraction, denoted as $n_{130}$, and the index of refraction of the outside media at the lower interface 126 is denoted as $n_{out}$. Both buffer component 120 and propagation component 130 are manufactured from materials having a high degree of optical transmission and low adsorption properties. Further, the index of refraction of propagation component 130, $n_{130}$, has a greater value than the index of refraction of buffer component 120, $n_{120}$, and the index of refraction of the outside medium, $n_{out}$, thereby permitting total internal reflection of the solar radiation in propagation component 130.

In one example propagation component 130 includes a refractive media such as a suitable plastic or glass and buffer component 120 includes a refractive media having a low index of refraction than propagation component 130, the buffer refractive media being a suitable plastic, glass, liquid or air. In another example the propagation component or the propagation component and the buffer component have a graded-index profile.

Referring to FIG. 2, as already noted, light rays 140a and 140b are incident from at least a first direction 139 and are redirected by light directing component 110 along at least second direction 143 as light rays 142a and 142b. Further, light rays 142a and 142b are refracted into propagation component 130 as light rays 144a and 144b and subsequent rays, such as 146a and 146b and 148a and 148b. The propagation of light ray 144b is governed by the same principles as light ray 144a. As such, it is understood that the following discussion of the propagation of light ray 144a is representative of light rays 144a and 144b, as well as additional light rays.

The direction of light ray 144a in propagation component 130 relative to the normal of interface 124 at the point of entry of light ray 144a is governed by the equation:

$$n_{120}\text{Sin}(\theta_{142a}) = n_{130}\text{Sin}(\theta_{144a1}) \quad (1)$$

Light ray 144a travels through propagation component 130 and is incident on interface 126 at an angle $\theta_{144a2}$ with respect to the normal of interface 126 at the point of incidence of light ray 144a. At interface 126 light ray 144a will be either refracted into the outside media or be reflected within propagation component 130 as light ray 146a. The direction of light ray 146a is governed by the equation:

$$n_{130}\text{Sin}(\theta_{144a2}) = n_{out}\text{Sin}(\theta_{out}) \quad (2)$$

The angle $\theta_{out}$ corresponds to the angle light ray 146a would make with the normal of interface 126 at the point of incidence of light ray 144a if light ray 146a is refracted into the outside media, $n_{out}$.

Light ray 146a may be retained within propagation component 130 by either reflection from a reflection coating (not shown) at interface 126 or by total internal reflection at interface 126. In order for light ray 146a to be totally internally reflected within propagation component 130, $\theta_{out}$ must be equal to or greater than 90°, such that $\theta_{146a1}$ is less than or equal to 90°. The value of $\theta_{out}$ may be greater than or equal to 90° when $n_{out}$ is less than $n_{130}$. As such, in order for light ray 146a to be totally internally reflected the following restriction should be satisfied:

$$\theta_{144a2} \geq \text{Sin}^{-1}\left(\frac{n_{out}}{n_{130}}\right) \text{ where } n_{out} < n_{130} \quad (3)$$

Therefore, as long as $\theta_{144a2}$ is greater than or equal to the quantity $\text{Sin}^{-1}(n_{out}/n_{130})$, light ray 144a is totally internally reflected within propagation component 130 as light ray 146a. However, if $\theta_{144a2}$ is less than the quantity $\text{Sin}^{-1}(n_{out}/n_{130})$, light ray 144a may still be reflected into propagation component 130 due to a reflection coating at interface 126. As seen from equation (3), the difference in value of $n_{out}$ and $n_{130}$ controls the range of acceptable angles, $\theta_{144a2}$, for total internal reflection. Table 1 shows the difference in acceptable angles, $\theta_{144a2}$, for various exemplary combinations of $n_{out}$ and $n_{130}$.

TABLE 1

Comparison of Acceptable angles for total internal reflection

| | | |
|---|---|---|
| $n_{out}$ = 1.0 (air) | $n_{130}$ = 1.49 (acrylic) | $\theta_{144a2} \geq 42.2°$ |
| $n_{out}$ = 1.0 (air) | $n_{130}$ = 1.586 (polycarbonate) | $\theta_{144a2} \geq 39.1°$ |
| $n_{out}$ = 1.49 (acrylic) | $n_{130}$ = 1.586 (polycarbonate) | $\theta_{144a2} \geq 70.0°$ |
| $n_{out}$ = 1.49 (acrylic) | $n_{130}$ = 2.02 (glass N-LASF35)* | $\theta_{144a2} \geq 47.5°$ |

*N-LASF35 glass along with additional suitable glass is available from Schott-Glas located at Business Segment Display, Hattenbergstr. 10, 55122 Mainz, Germany.

As seen in Table 1, the larger the difference in $n_{out}$ and $n_{130}$ the greater range of acceptable angles, $\theta_{144a2}$, that satisfy the condition of equation (3).

In the same manner light ray 146a is totally internally reflected at interface 124 as light ray 148a when $\theta_{146a2}$ is greater than or equal to the quantity $\text{Sin}^{-1}(n_{120}/n_{130})$ as expressed in equation (4).

$$\theta_{146a2} \geq \text{Sin}^{-1}\left(\frac{n_{120}}{n_{130}}\right) \text{ where } n_{120} < n_{130} \quad (4)$$

As such, light ray 144a remains in propagation component 130 and propagates toward first end 132 of propagation component 130 as long as the relations in equations (3) and (4) are satisfied. It is understood that subsequent rays such as light ray 148a are retained in propagation component 130 as light ray 150a by reflection from a reflection coating or by total internal reflection.

It should be noted that although solar collector 100 is shown in FIG. 2 as a planar device, the invention is not limited to planar solar collectors nor are equations (3) and (4). On the contrary, in one embodiment, solar collector 100 is made of flexible material such that light directing component 110, buffer component 120 and propagation component 130 are not rigid, but able to bend. Further, propagation component 130 may be tapered such that an overall height or width of propagation component 130 is reduced or enlarged. However, in order for the solar collector to capture solar radiation in propagation component 130 and have that solar radiation propagate towards first end 132, the degree of bend of propagation component 130 and buffer component 120 or the degree of tapering of propagation component 130 is restricted by the angular requirement for total internal reflection given above in equations (3) and (4).

Further, in one variation, solar collector 100 includes a protective layer of material (not shown) that protects light directing component 110 from direct exposure to the elements and other sources of possible damage.

In one embodiment of solar collector 100, light directing component 110 is configured to redirect incident solar radiation by reflection instead of transmission. As such, incident solar radiation from a direction 145, shown in FIG. 2 passes through propagation component 130 and buffer component 120 and is incident on light directing component 110. Light directing component 110 is configured to redirect the incident solar radiation back through buffer component 120 and wherein the solar radiation is retained in propagation component 130 due to at least total internal reflection. In one example light directing component 110 includes a holographic element configured to reflect the incident solar radiation.

Figure 3:
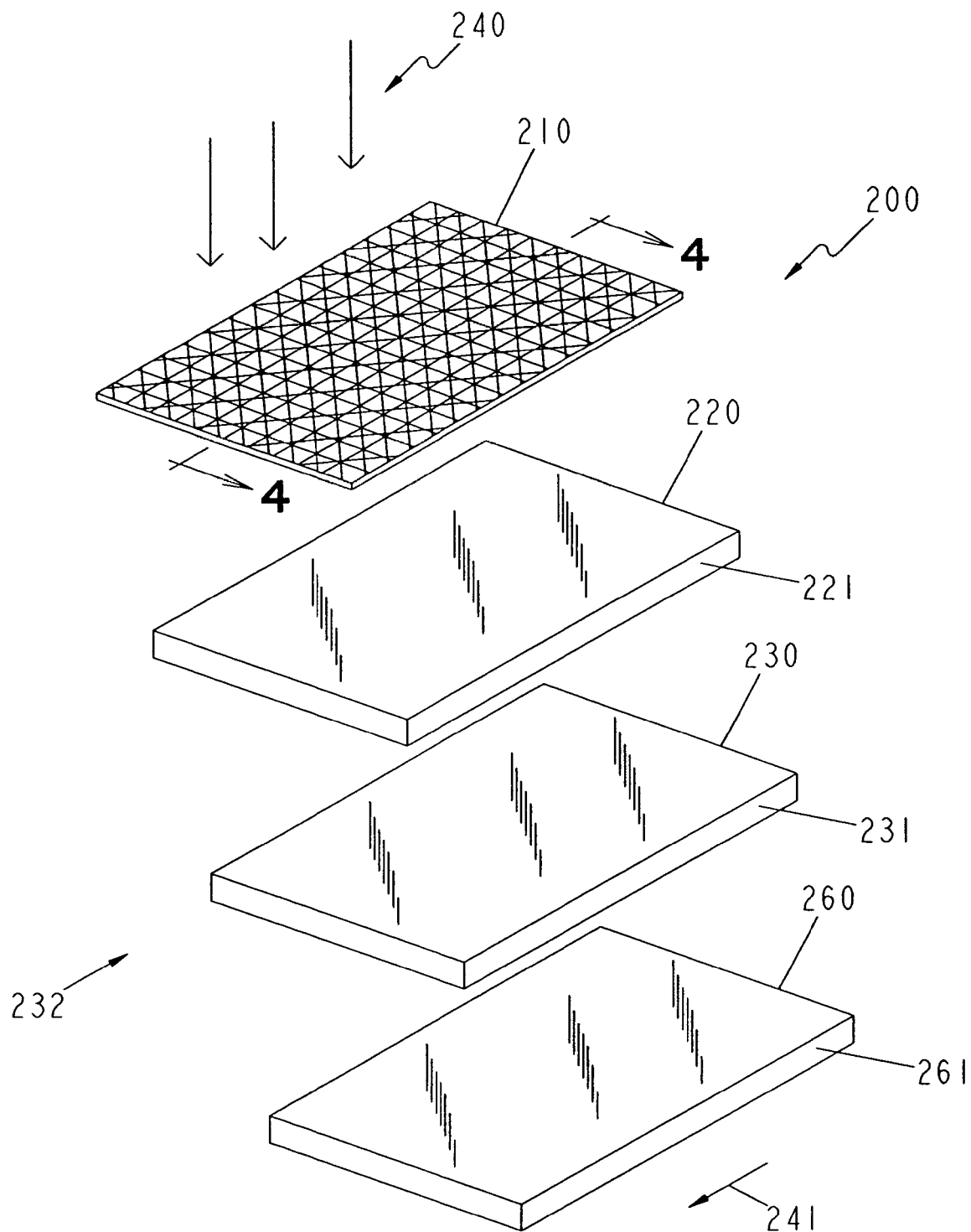
FIG. 3 is an exploded, perspective view of a second embodiment of a solar collector including a radiation directing component, a first buffer component, a propagation component, and a second buffer component.

Referring to FIG. 3, a solar collector 200 is shown. Solar collector 200 is generally identical to solar collector 100 and comprises a light directing component 210, a first buffer component 220, a propagation component 230, and a second buffer component 260 which is coupled to the lower side of propagation component 230. Light directing component 210, in one example, includes a holographic element. Light directing component 210, in another example, includes a diffraction grating or ruling. Propagation component 230, in one example, is made of a refractive media such as a suitable plastic or glass or liquid. Buffer components 220 and 260, in one example, are comprised of a refractive media having a lower index of refraction than propagation component 230 such as a plastic material, a glass material, a liquid, or air.

Figure 4:
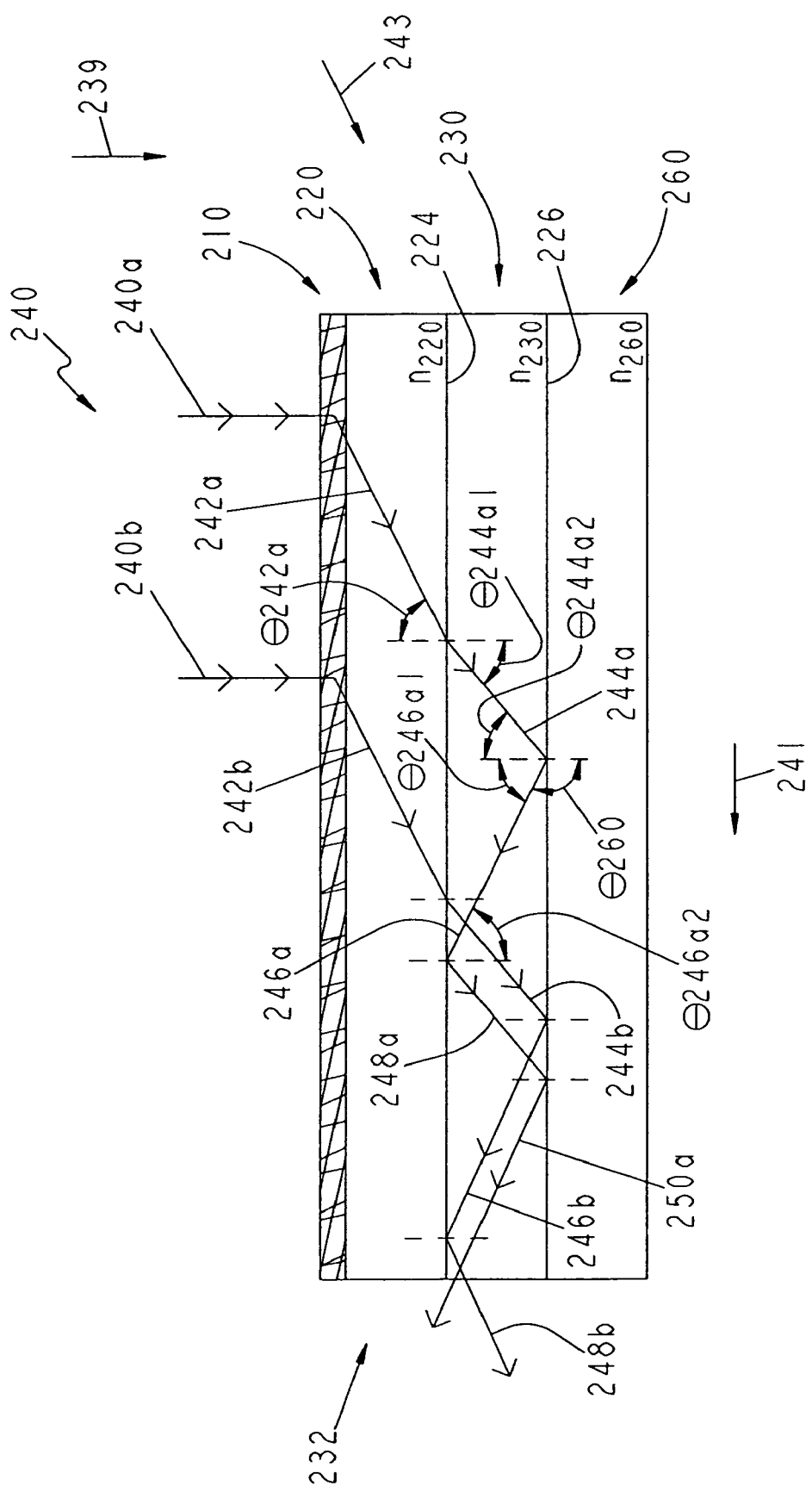
FIG. 4 is a cross-section view of the solar collector of FIG. 3 corresponding to the solar collector in an assembled configuration.

Light directing component 210, first buffer component 220, propagation component 230 and second buffer component 260 are coupled together with a suitable optical adhesive. Second buffer component 260 provides protection to propagation component 230 to minimize potential damage to propagation component 230. Further, as indicated in FIG. 4, second buffer component 260 has an index of refraction, $n_{260}$, which is equal to the index of refraction of first buffer component 220, $n_{220}$. As such, the range of acceptable angles, $\theta_{244a2}$ and $\theta_{246a2}$ for total internal reflection, are the same for both interface 224 and interface 226. In one embodiment, interface 226 between propagation component 230 and second buffer component 260 includes a reflection coating to reflect rays not within the range of acceptable angles. In another embodiment, surfaces 221, 231, and 261 of first buffer component 220, propagation component 230, and second buffer component 260 include a reflection coating.

Referring to FIG. 4, light rays 240a and 240b are redirected by light directing component 210 from at least a first direction 239 along at least a second direction 243 as light rays 242a and 242b. Further, light rays 242a and 242b are refracted into propagation component 230 as light rays 244a and 244b and subsequent rays, such as 246a and 246b and 248a and 248b. The propagation of light ray 244b is governed by the same principles as light ray 244a. As such, it is understood that the following discussion of the propagation of light ray 244a is representative of light rays 244a and 244b, as well as additional light rays.

The direction of light ray 244a in propagation component 230 relative to the normal of interface 224 at the point of entry of light ray 244a is governed by the equation:

$$n_{220}\mathrm{Sin}(\theta_{242a}) = n_{230}\mathrm{Sin}(\theta_{244a1}) \quad (5)$$

Light ray 244a travels through propagation component 230 and is incident on interface 226 at an angle $\theta_{244a2}$ with respect to the normal of interface 226 at the point of incidence of light ray 244a. At interface 226 light ray 244a will be either refracted into second buffer component 260 or be reflected within propagation component 230 as light ray 246a. The direction of light ray 246a is governed by the equation:

$$n_{230}\mathrm{Sin}(\theta_{244a2}) = n_{260}\mathrm{Sin}(\theta_{260}) \quad (6)$$

The angle $\theta_{260}$ corresponds to the angle light ray 246a would make with the normal of interface 226 at the point of incidence of light ray 244a if light ray 244a is refracted into second buffer component 260. In order for light ray 246a to be totally internally reflected within propagation component 230, $\theta_{260}$ must be equal to or greater than 90°, such that $\theta_{246a1}$ is less than or equal to 90°. The value of $\theta_{260}$ may be greater than or equal to 90° when $n_{260}$ is less than $n_{230}$. As such, in order for light ray 246a to be totally internally reflected the following restriction should be satisfied:

$$\theta_{244a2} \geq \mathrm{Sin}^{-1}\left(\frac{n_{260}}{n_{230}}\right) \text{ where } n_{260} < n_{230} \quad (7)$$

Therefore, as long as $\theta_{244a2}$ is greater than or equal to the quantity $\mathrm{Sin}^{-1}(n_{260}/n_{230})$, light ray 244a is totally internally reflected within propagation component 230 as light ray 246a. As seen from equation (7), the difference in value of $n_{230}$ and $n_{260}$ controls the range of acceptable angles, $\theta_{244a2}$, for total internal reflection. The larger the difference in $n_{260}$ and $n_{230}$ the greater range of acceptable angles, $\theta_{244a2}$, that satisfy the condition of equation (7).

In the same manner light ray 246a is totally internally reflected at interface 224 as light ray 248a when $\theta_{246a2}$ is greater than or equal to the quantity $\mathrm{Sin}^{-1}(n_{220}/n_{230})$ as expressed in equation (8).

$$\theta_{246a2} \geq \mathrm{Sin}^{-1}\left(\frac{n_{220}}{n_{230}}\right) \text{ where } n_{220} < n_{230} \quad (8)$$

As such, light ray 244a and subsequent light rays 246a, 248a, and 250a remain in propagation component 230 and propagates toward first end 232 of propagation component 230 generally in direction 241 as long as the relations in equations (7) and (8) are satisfied. When $n_{260} = n_{220}$, equations (7) and (8) provide identical ranges of acceptable angles.

Figure 5:
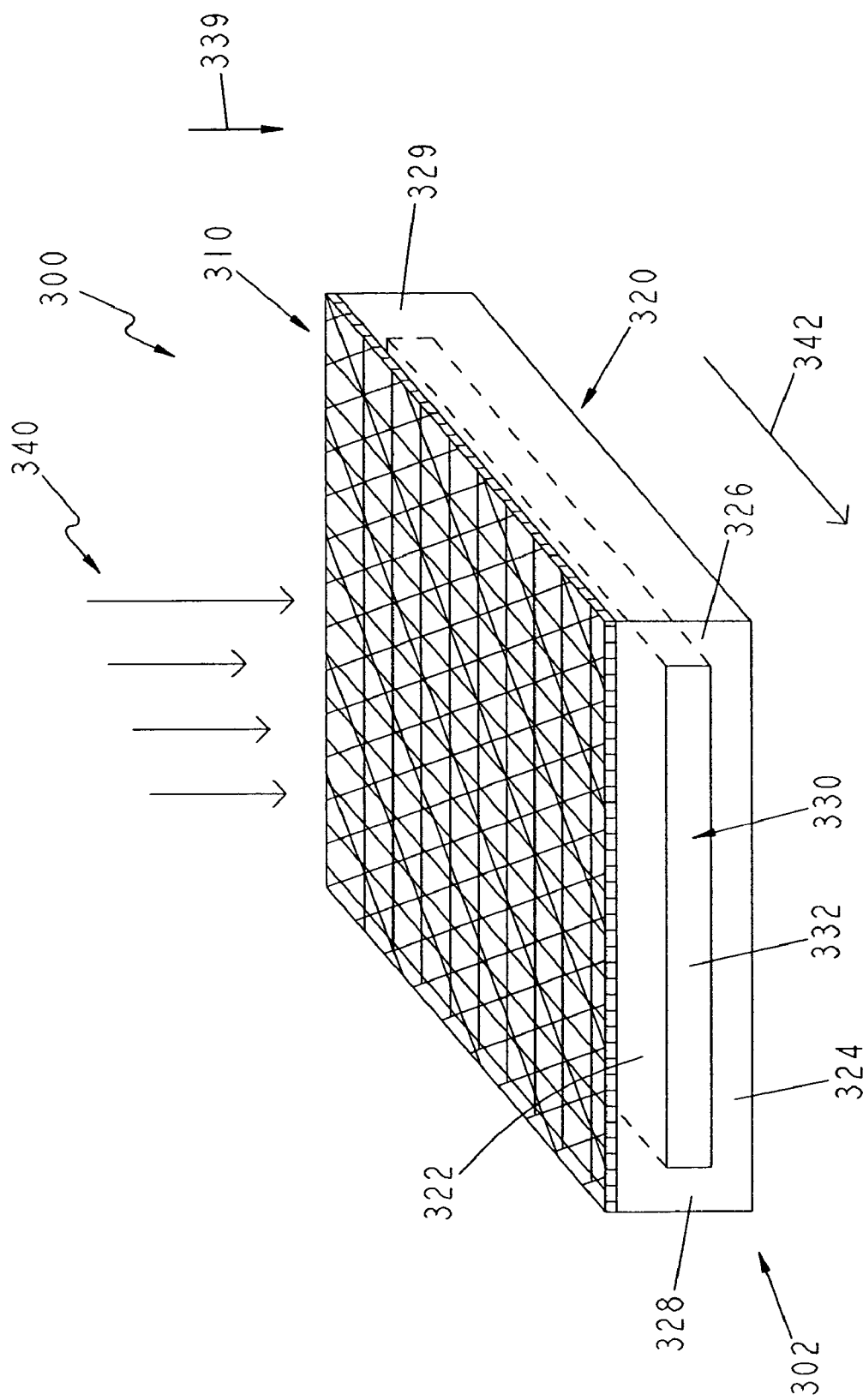
FIG. 5 is a perspective view of a third embodiment of a solar collector including a radiation directing component, a propagation component, and a buffer component, the buffer component surrounding the propagation component except for at least a first surface of the propagation component.

Referring to FIG. 5, a solar collector 300 is shown. Solar collector 300 comprises a light directing component 310, a buffer component 320, and a propagation component 330. Solar collector 300 is generally identical to solar collector 100 and solar collector 200. Light directing component 310, in one example, includes at least one holographic element. Light directing component 310, in another example, includes at least one diffraction grating or ruling. Propagation component 330, in one example, includes a refractive media such as a suitable plastic or glass or liquid. Buffer component 320, in one example, includes a refractive media having a lower index of refraction than propagation component 330 such as a plastic material, a glass material, a liquid, or air.

The buffer component 320 of solar collector 300 includes a top portion 322, a bottom portion 324, a first side portion 326, a second side portion 328, and a rear portion 329 which provide a constant interface around the entire propagation component 330 except for a portion 332 located at a first end 302 of solar collector 300. Light directing component 310 is configured to redirect incident solar radiation from at least a first direction 339, denoted by rays 340, such that the solar radiation is coupled into propagation component 330 and generally propagates along direction 342 within propagation component 330 due to at least total internal reflection at the interface between propagation component 330 and buffer component 320. The light propagating in the general direction 342 exits solar collector 300 from portion 332 of propagation component 330 at first end 302 of solar collector 300.

In one embodiment, buffer component 320 provides a constant interface around the entire propagation component 330 such that propagation component 330 is sealed from the exterior of collector 300 and radiation directing component 310 is configured to redirect radiation emanating from an optical source, such as the sun, a laser, a laser diode, or a phosphorescence or fluorescence material. The radiation from the radiation source is coupled into propagation component 330 by radiation directing component 310 and is retained within propagation component 330 by total internal reflection at the interface between propagation component 330 and buffer component 320 such that the radiation is propagated within propagation component 330 in direction 342. The collected radiation at first end 332 of propagation component 330 is generally incident on the interface between buffer component 320 and propagation component 330 at an angle such that the radiation is refracted or transmitted through buffer component 320 and may be subsequently coupled to an output component 340. In one example, an output component 340 is positioned proximate to first end 332 of propagation component 330 through an opening (not shown) in buffer component 320.

In one example the radiation source is a phosphorescence or fluorescence material applied to a lower surface (not shown) of buffer component 320 or on top of a radiation directing component configured to redirect the resultant radiation. As such, the radiation produced from the phosphorescence or fluorescence material is transmitted through the lower portion 324 of buffer component 320 and is either transmitted into propagation component 330 at an angle such that it is retained within propagation component 330 due to total internal reflection or is transmitted through propagation component 330, the upper portion 322 of buffer component 320 and is incident on radiation directing component 310. Radiation directing component 310 is configured to reflect the incident radiation back into upper portion 322 of buffer component 320 at an angle such that the radiation is transmitted into propagation component 330 and retained within propagation component 330 due to total internal reflection.

In another example, wherein propagation component 330 is sealed within buffer component 320. Propagation component 330 includes a phosphorescence or fluorescence material and radiation directing component 310 is configured to pass incident radiation from at least direction 339 such that at least a portion of the incident radiation is transmitted into propagation component 330. The incident radiation excites or otherwise causes the phosphorescence or fluorescence material to emit radiation. The emitted radiation is either propagated within propagation component 330 generally in direction 342 due to total internal reflection or is transmitted out of propagation component 330, through buffer component 320 and is incident on radiation directing component 310. The emitted radiation is redirected or reflected by radiation directing component 310 back through buffer component 320 and into propagation component 330 such that the emitted radiation is propagated within propagation component 330 generally in direction 342 due to total internal reflection. In one variation, radiation directing component 310 is positioned on multiple exterior surfaces of buffer component 320.

Solar collectors 100, 200, and 300 are manufactured in one embodiment from extrudable material such as various plastics. Exemplary extruded plastics include extruded acrylics and extruded polycarbonates available from Bay Plastics Ltd located at Unit H1, High Flatworth, Tyne Tunnel Trading Estate, North Shields, Tyne & Wear, in the United Kingdom. In the case of solar collectors 100, 200, 300 the propagation components 130, 230, and 330 and the buffer components 120, 220, 260, and 320 are extruded separately and then assembled. In one example, the various layers are coupled together with a suitable optical adhesive. In another example, the various layers are coupled together by pressing the layers into contact with each other while the layers are at an elevated temperature to "thermally weld" the various layers together. In an alternative method, propagation component 330 of solar collector 300 is first extruded and then buffer component 320 is extruded over propagation component 330.

Light directing component 110, 210, and 310 in one embodiment is then coupled to the respective assembled buffer components 120, 220, and 320 with a suitable optical adhesive. In another embodiment, light directing component 110, 210, and 310 is formed on a top surface of buffer component 120, 220, and 320. One example of light directing component 110, 210, and 310 being formed on buffer component 120, 220, and 320 is the stamping or pressing of a diffraction grating or ruling pattern in the top surface of buffer component 120, 220, and 320.

In other embodiments of solar collectors 100, 200, and 300, the solar collectors are assembled from cast components, such as cast acrylic, or a combination of cast components and extruded components or from optical components manufactured by various other manufacturing processes. Exemplary cast acrylic components include HESA-GLAS from Notz Plastics AG and available from G-S Plastic Optics located 23 Emmett Street in Rochester, N.Y. 14605.

Figure 6A:
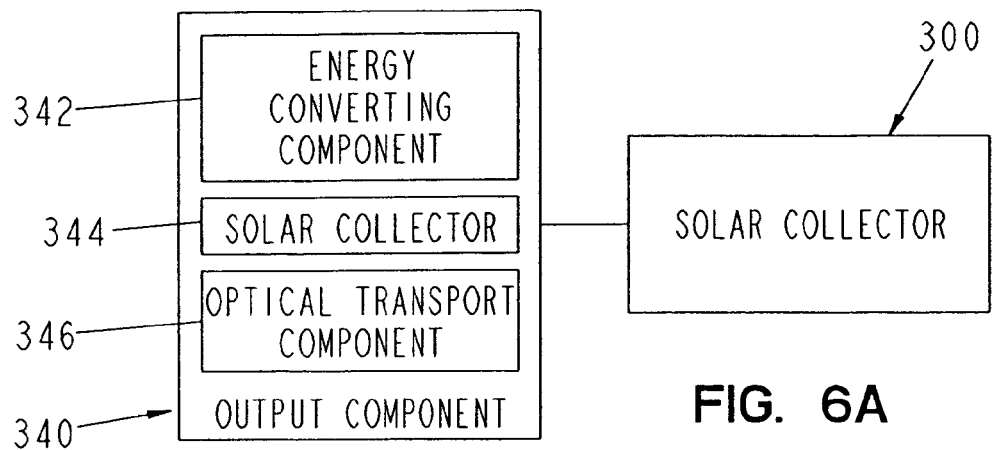
FIG. 6A is a diagrammatic representation of a non-tracking embodiment of the present invention including a solar collector coupled to an energy converting component.

Once the solar radiation reaches the first end of solar collector 100, solar collector 200 or solar collector 300, the solar radiation exits the respective propagation component 130, 230, 330 and is coupled to an output component 340 as diagrammatically shown in FIG. 6A. Output component 340 is configured to receive the solar radiation exiting propagation component 330 and to transport and/or otherwise utilize the solar radiation. Example output components include energy converting component 342, a second solar collector 344, and an optical transport component 346.

Energy converting component 342 is configured to convert the solar radiation into another form of energy for storage or use. Example energy converting components 342 include any photoelectrical transducer, or any photochemical transducer, or any type of radiation detector. An example photoelectrical transducer is a photovoltaic cell or solar cell. An example photochemical transducer is a synthetic chlorophyll which can absorb the supplied radiation to produce fuels such as oxygen or hydrogen. Example radiation detectors include silicon detectors available from Edmund Industrial Optics located at 101 East Gloucester Pike, in Barrington, N.J. USA 08007.

Second solar collector 344 includes a light directing component generally similar to light directing components 110, 210, 310, a buffer component generally similar to buffer components 120, 220, 260, 320, and a propagation component generally similar to propagation components 130, 230, 330. Second solar collector 344 is configured to receive solar radiation exiting propagation component 330 of solar collector 300 from at least a first direction, such as direction 341 in FIG. 7A and to redirect the solar radiation along at least a second direction, such as direction 343 in FIG. 7A. In one example, the light directing component of solar collector 344 is configured to receive solar radiation from multiple directions corresponding to the multiple directions of totally internally reflected light rays within propagation component 330. Alternatively, second solar collector 344 is abutted to first end 302 of solar collector 300 and is configured to receive solar radiation exiting the propagation component of solar collector 300 from at least a first direction directly into the propagation component of solar collector 344 such that the solar radiation propagates within solar collector 344 along with additional solar radiation being redirected and propagated by solar collector 344.

Optical transport component 346 is configured to transport the solar radiation exiting propagation component 330 to a remote location. Optical transport component 346 operates similar to fiber optics and includes a buffer component, such as buffer component 320, and a propagation component, such as propagation component 330 of solar collector 300.

Figure 6B:
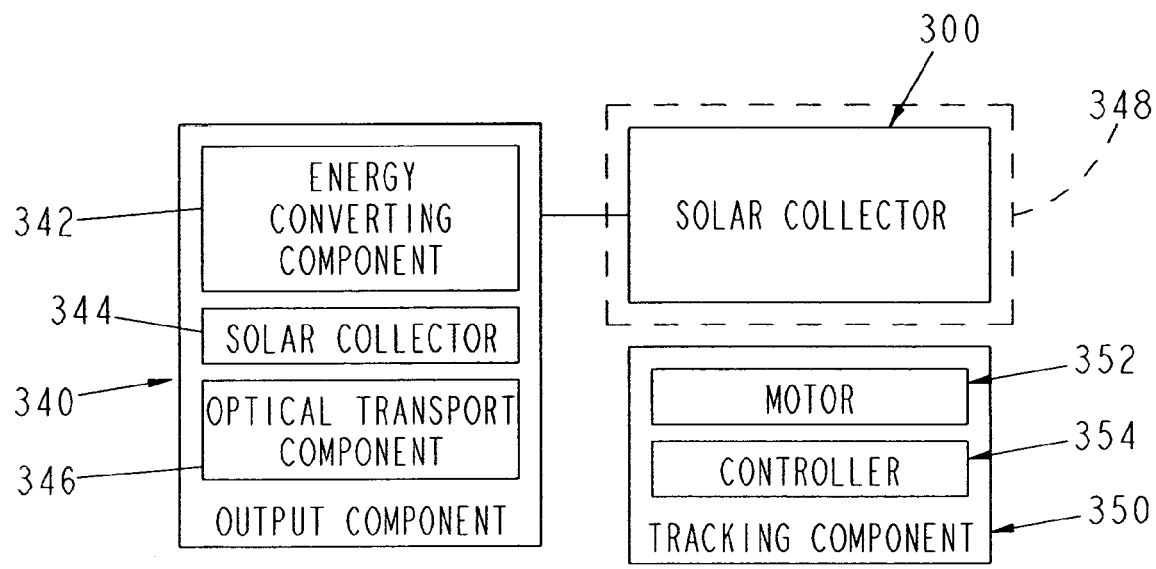
FIG. 6B is a diagrammatic representation of a tracking embodiment of the present invention including a solar collector coupled to a frame and to an energy converting component, the frame and the solar collector being moveable and positionable by a tracking component.
Figure 6C:
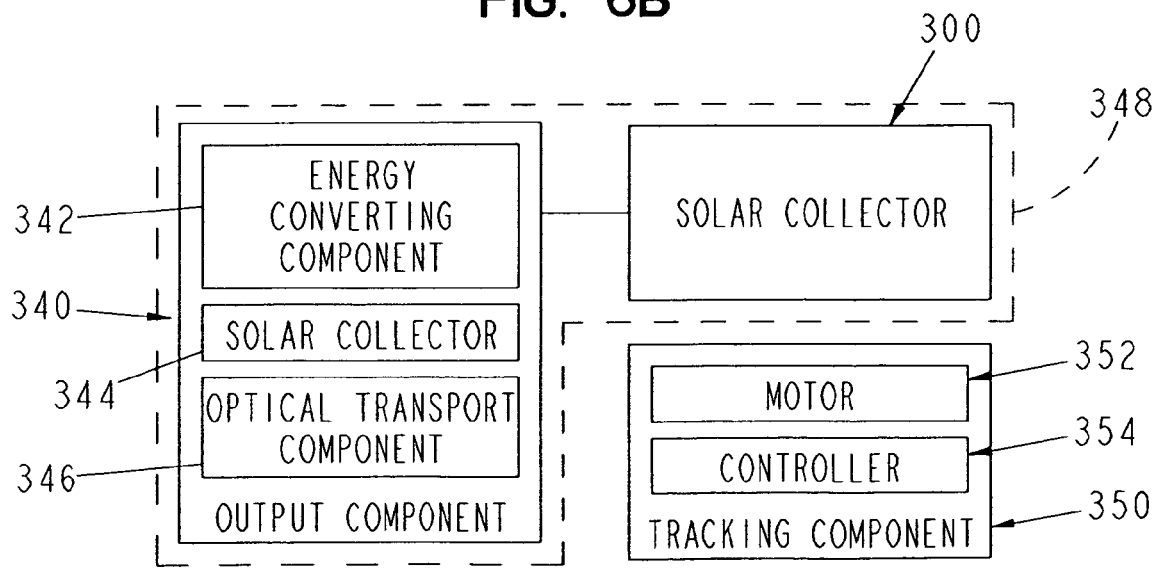
FIG. 6C is a diagrammatic representation of a tracking embodiment of the present invention including a solar collector, coupled to an energy converting component, the solar collector and the energy converting component being coupled to a frame, the frame, solar collector, and energy converting component being moveable and positionable by a tracking component.

Referring to FIG. 6B, solar collector 300 in another embodiment is coupled to a frame 348 and is coupled to an output component 340. Frame 348 is coupled to a tracking component 350 which is configured to move and position solar collector 300. Referring to FIG. 6C, solar collector 300 is coupled to output component 340 and both solar collector 300 and output component 340 are coupled to frame 348. Frame 348 is coupled to a tracking component 350 which is configured to move and position solar collector 300. Tracking component 350 is configured to move solar collector 300 such that solar collector 300 is capable of tracking the sun throughout a given day and various seasons of the year. Tracking component 350 comprises a positioning component 352, such as a motor, and a controller 354, such as a computer. Controller 354 is configured to control positioning component 352 and hence the movement of solar collector 300. In one example controller 354 executes instructions from either software or hardware which provide the preferred position of solar collector 300 for a given time of day and a given time of the year.

Figure 7A:
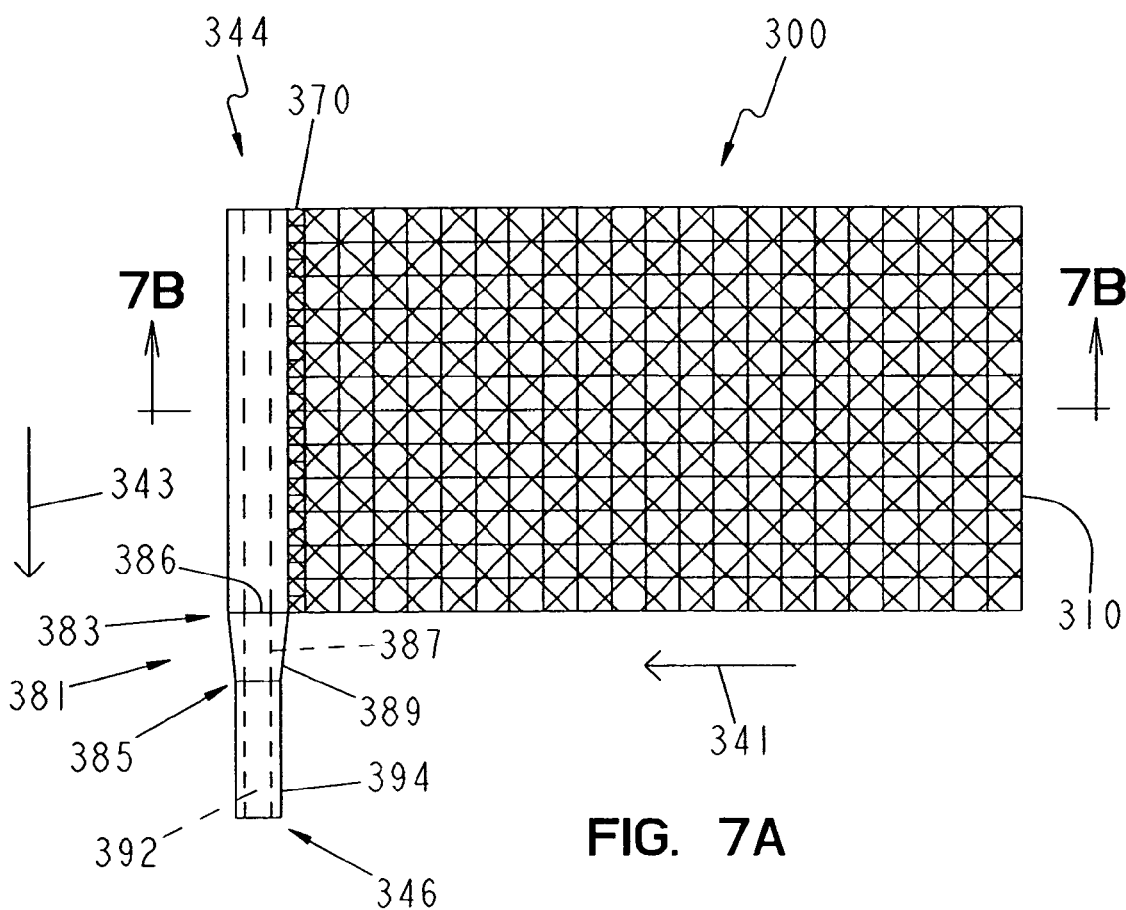
FIG. 7A is top view of the solar collector of FIG. 5 coupled to a second solar collector and an optical transport component through an adaptor component, the adapter component tapering from a generally quadrilateral cross-section to a generally circular cross-section.
Figure 7B:
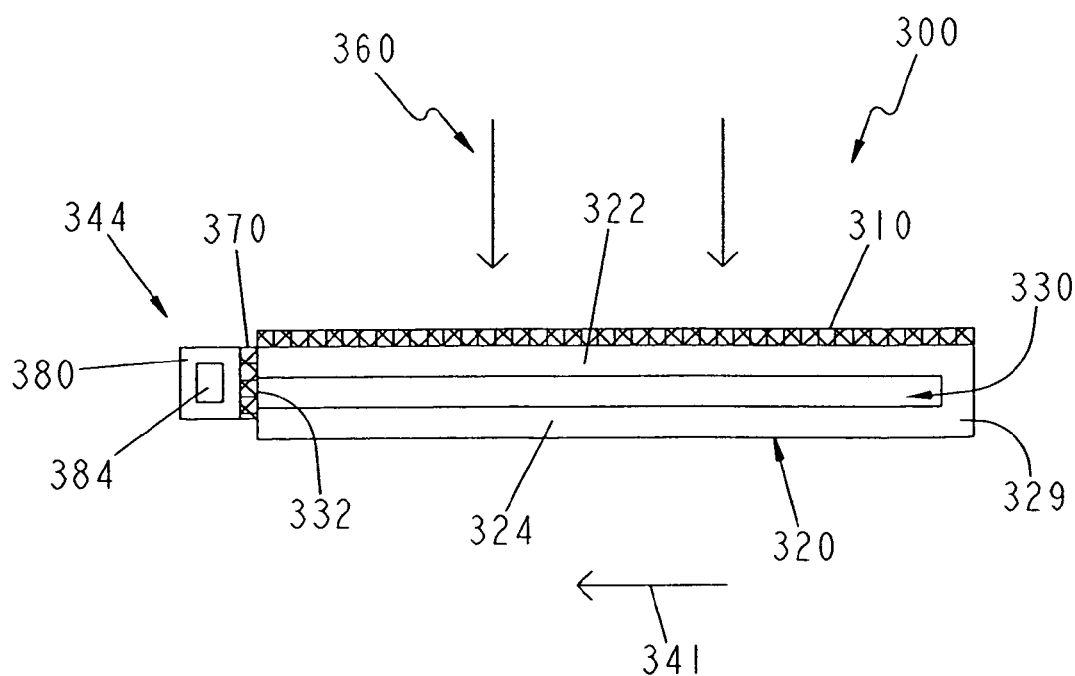
FIG. 7B is a cross-section view of the solar collector and second solar collector of FIG. 7A.
Figure 7C:
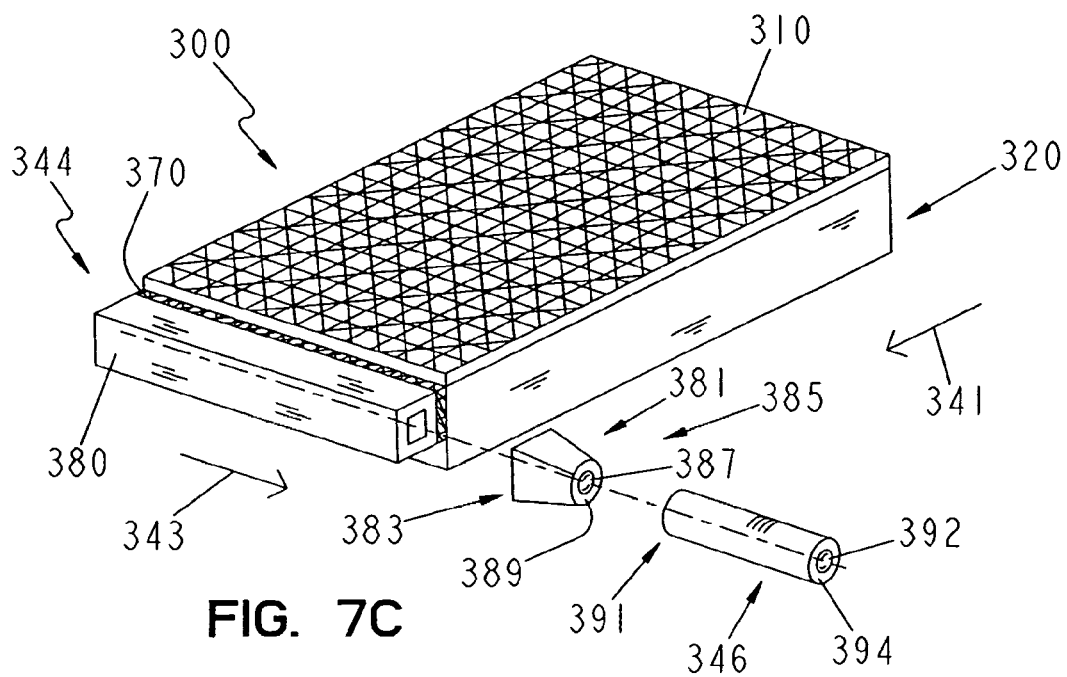
FIG. 7C is a perspective view of the solar collector of FIG. 7A showing the adapter and the optical transport component in an exploded configuration.

Referring to FIGS. 7A–7C, a first example configuration of solar collector 300 is shown wherein solar collector 300 is coupled to solar collector 344 which in turn is coupled to optical transport component 346. Incident solar radiation 360 is redirected by light directing component 310 such that the solar radiation is propagated in propagation component 330 generally in a direction 341. The solar radiation exits propagation component 330 from portion 332 of propagation component 330 and is incident on light directing component 370 of solar collector 344. Light directing component 370 is configured to redirect the solar radiation from propagation component 330 through buffer component 380 and into propagation component 384 such that the solar radiation is propagated within propagation component 384 generally along direction 343.

The solar radiation exits propagation component 384 at portion 386 of propagation component 384 and is coupled into optical transport component 346 through an adapter 381. Adapter 381 includes a propagation component 387 and a buffer component 389. In one example, propagation component 387 and propagation component 384 have approximately the same index of refraction and buffer component 389 and buffer component 380 have approximately the same index of refraction. Adapter 381 is configured to propagate the solar radiation from a first end 383 to a second end 385 by retaining the solar radiation within propagation component 392 due to total internal reflection. Further, in the illustrated embodiment adapter 381 is configured to mate with a generally quadrilateral cross-section of solar collector 344 at first end 383 of adapter 381 and to mate with a generally circular cross-section of a first end 391 of optical transport component 346 at second end 385 of adapter 381. It should be understood that adapter 381 is configured to couple together two components having dissimilar cross sections. Further, adapter 381 may be used in conjunction with couplers 616 and 624 shown in FIGS. 12A and 12B and described below.

Optical transport component 346 includes a propagation component 392 and a buffer component 394. In one example, propagation component 392 and propagation component 387 have the same index of refraction and buffer component 394 and buffer component 389 have the same index of refraction. Optical transport component 346 is configured to propagate the solar radiation to a remote location by retaining the solar radiation within propagation component 392 due to total internal reflection.

Figure 7D:
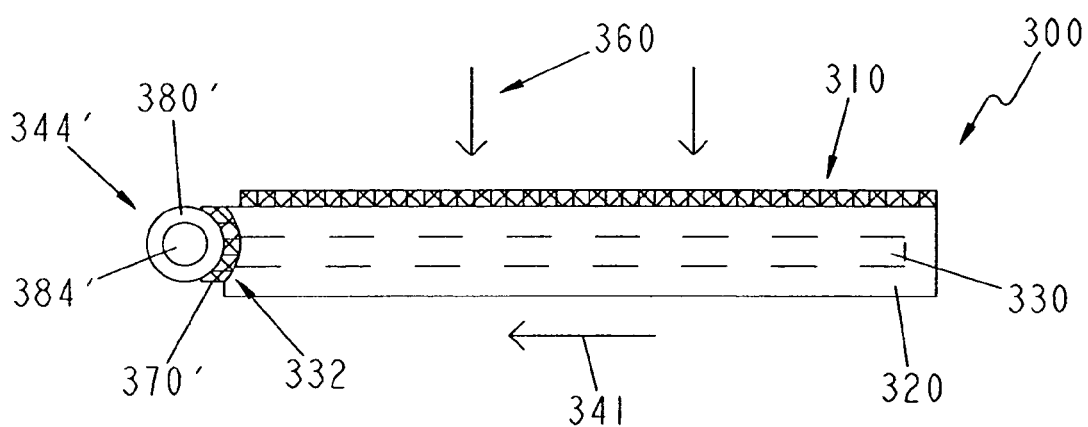
FIG. 7D is a side view of the solar collector of FIG. 7A and a second solar collector having a generally circular cross-section.

Referring to FIG. 7D, solar collector 344 is replaced by solar collector 344' which operates generally identical to solar collector 344. Solar collector 344' differs from solar collector 344 in that propagation component 384', buffer component 380', and light directing component 370' are generally cylindrical in shape. As shown in FIG. 7D first end 332 of solar collector 300 has been modified to have a concave extent configured to mate with light directing component 370' of solar collector 344'. In one embodiment, solar collector 344' is made from an optical transport component 346 having a generally circular cross-section along its extent and a light directing component 370' coupled to a portion of buffer component 394 of optical transport component 346.

Figure 7E:
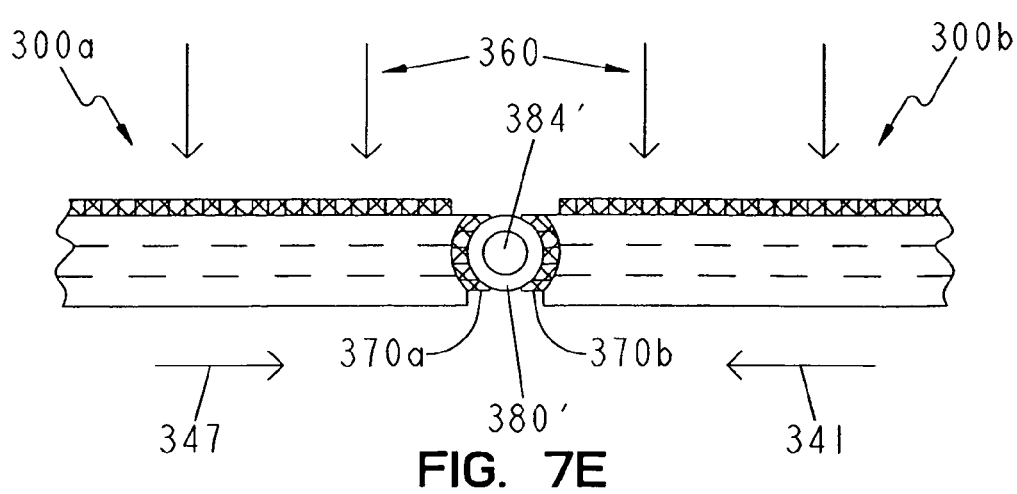
FIG. 7E is a side view of a first and a second solar collector coupled to an intermediate solar collector, the intermediate solar collector having a first radiation directing component for coupling the first solar collector and a second radiation directing component for coupling the second solar collector.

Referring to FIG. 7E, solar collector 344' is formed from a circular optical transport component 346 having two light directing components 370a and 370b. Light directing component 370a is configured to receive solar radiation from solar collector 300a propagating in direction 347 and light directing component 370b is configured to receive solar radiation from solar collector 300b propagating in direction 341.

Figure 8:
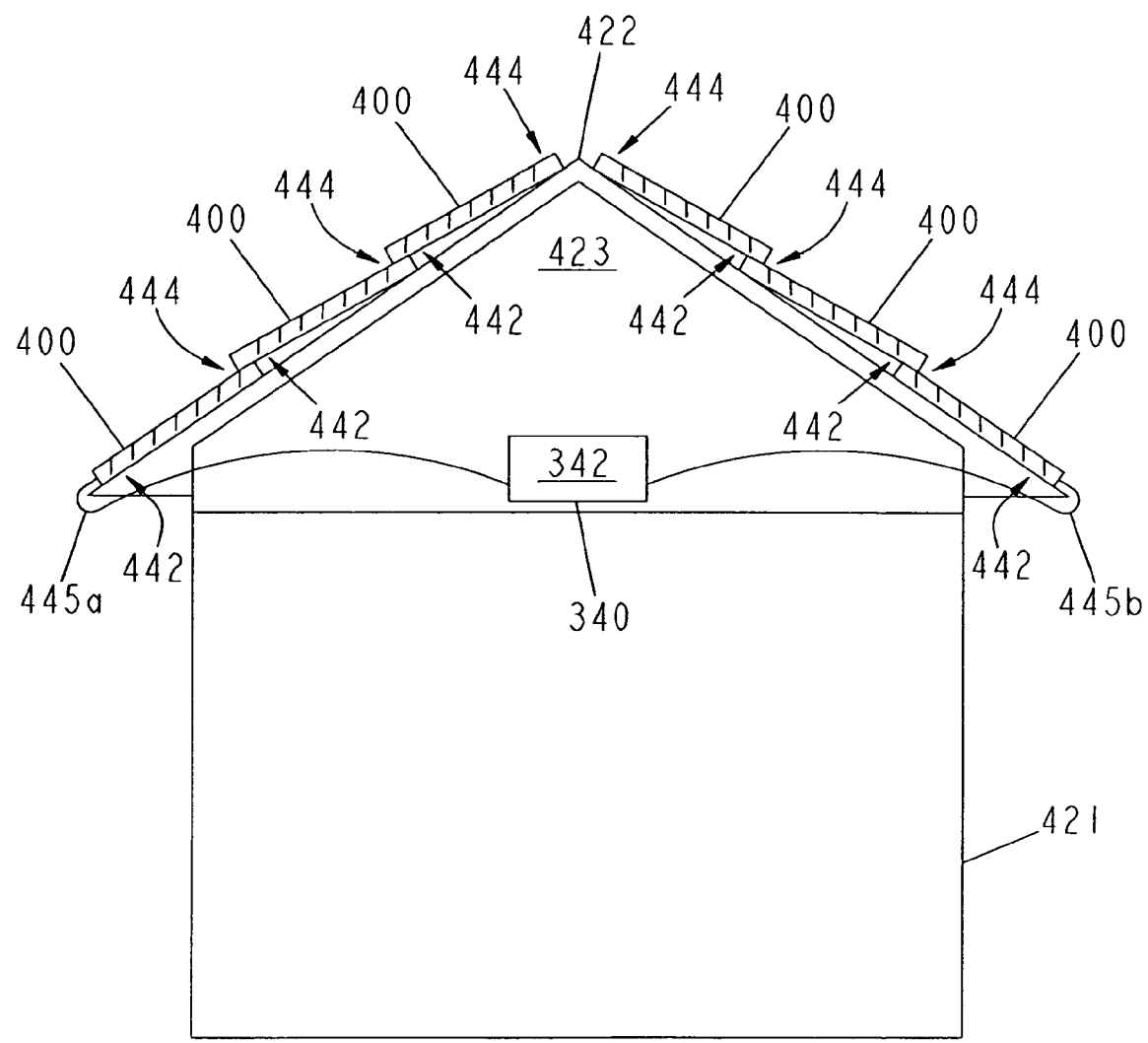
FIG. 8 is a schematic, side, elevational representation of a building having a plurality of solar collectors affixed to a roof of the building.

In some applications, the solar collectors of the present invention are used on surfaces of buildings, such as roofs, or exterior walls to collect solar radiation and to provide the solar radiation to an output component or for lighting applications. Referring to FIG. 8, a side, elevational, schematic representation of a plurality of solar collectors 400 affixed to a roof 422 of a building 421 is shown. Solar collectors 400 are generally similar to solar collectors 100, 200, and 300. As stated previously the radiation collected by solar collector 400 is coupled into an output component 340. As illustrated in FIG. 8, solar collectors 400 are coupled through additional solar collectors (not shown) to optical transport components 445a, 445b. Optical transport components 445a, 445b in turn transport the solar energy collected by solar collectors 400 to a remote location, such as an interior 423 of building 421 as shown in FIG. 8. As such, optical transport components 445a, 445b provide the solar radiation for remote lighting applications or for coupling to an output component 340, such as an energy converting component 342. It is therefore possible with the present invention to collect solar radiation at a relatively high temperature environment and to transport that radiation to a relatively lower temperature environment. As such, energy converting component 342 can be supplied with adequate amounts of solar radiation and also be positioned in an environment that correlates to a preferred operating condition of energy converting component 342.

Figure 9A:
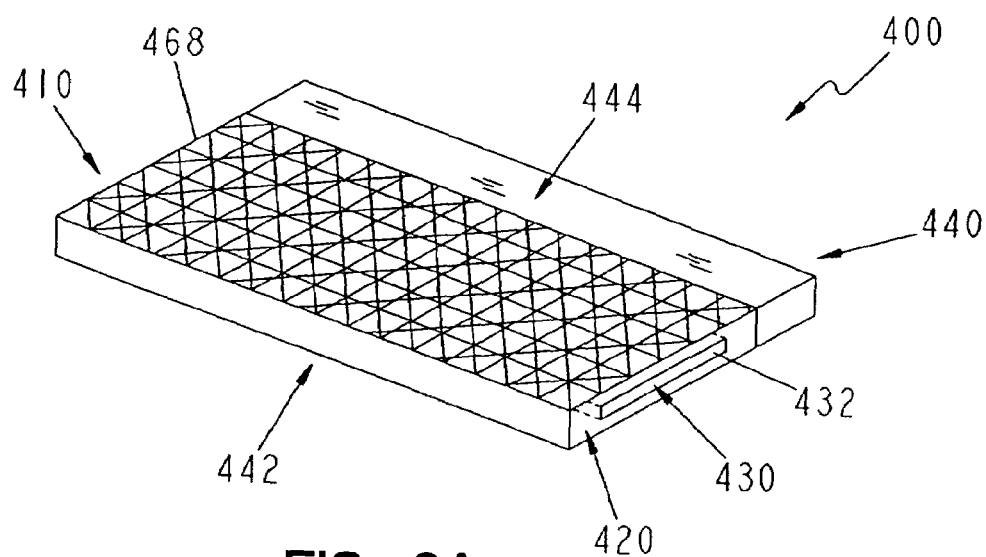
FIG. 9A is a perspective view of a first embodiment of a solar sheeting, the solar sheeting comprising a solar collector coupled to an attachment component.
Figure 9B:
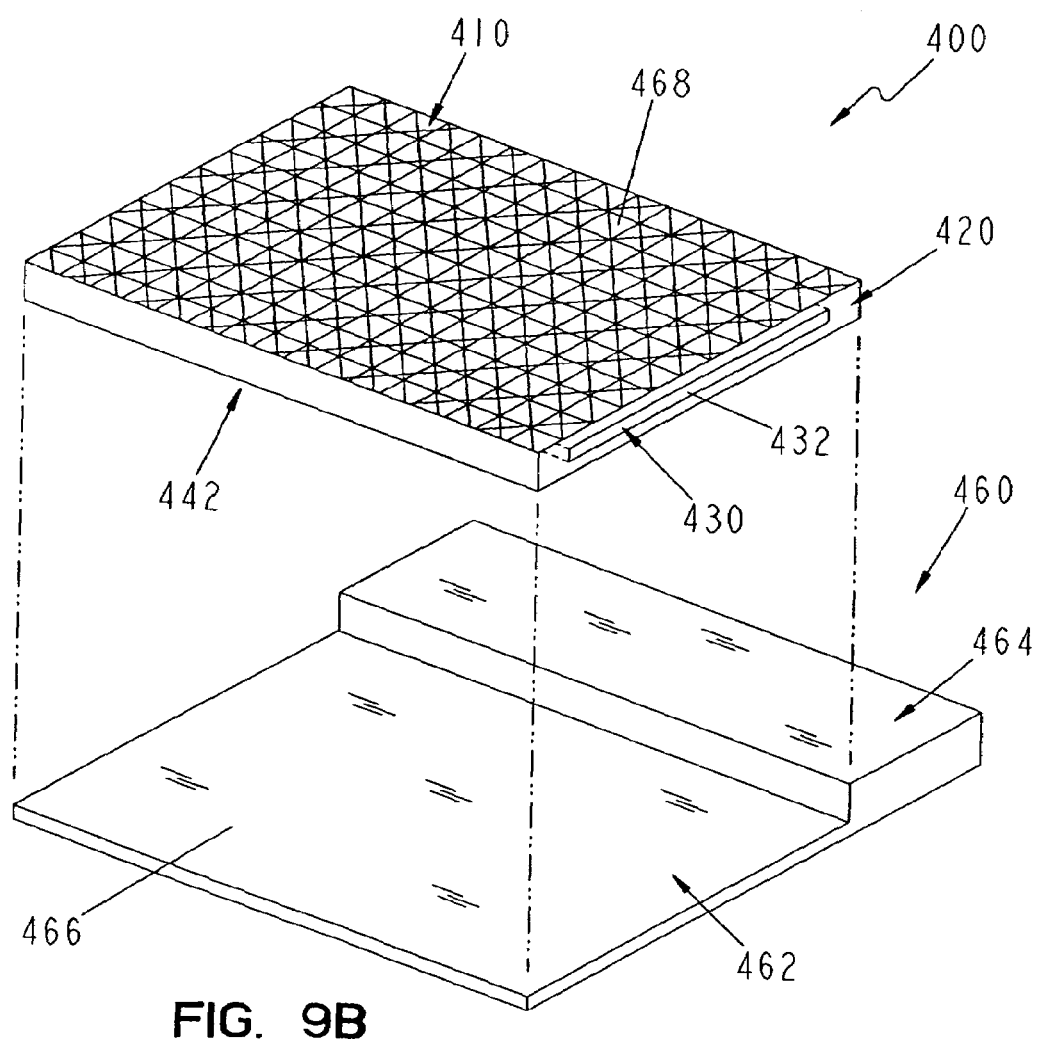
FIG. 9B is an exploded, perspective view of a second embodiment of a solar sheeting, the solar sheeting comprising a solar collector and an attachment component.

Referring to FIG. 9A, a first embodiment of solar collector 400 is shown. Solar collector 400 is configured as an alternative to conventional shingles, for use on roof 422. Solar collector 400 operates generally identical to solar collectors 100, 200, 300 and includes a light directing component 410, a buffer component 420, and a propagation component 430. Further, solar collector 400 includes an attachment component 440 configured to receive fastening components (not shown), such as nails, screws or staples, to secure solar collector to roof 422 of building 421. Attachment component 440 is made of a material suitable for accepting fastening components and securing solar collector 400 to roof 422 of building 421.

Since solar collector 400 is secured to roof 422, light directing component 410 is configured to receive solar radiation from multiple directions and to redirect the incident radiation such that it is propagated within propagation component 430. Further, light directing component 410 is configured to receive solar radiation corresponding to multiple wavelengths. Solar collector 400 further includes a protective component (not shown) which overlays at least light directing component 410 to protect light directing component 410 from the elements and other potential sources of damage. The protective component is comprised of a material that has good optical transmission properties and is generally weather-resistant. In an alternative embodiment, light directing component 410 is positioned below buffer component 420 to protect light directing component 410 from the elements.

When a plurality of solar collectors 400 are positioned on roof 422, as shown in FIG. 8, a bottom portion 442 of buffer component 420 of a first solar collector overlaps a top portion 444 of attachment component 440 of an adjacent and lower solar collector, similar to how conventional shingles overlap when positioned on roof 422. In one variation of solar collector 400, either top portion 444 of attachment component 440 or bottom portion 442 of buffer component 420 has an adhesive applied thereto to assist in securing adjacent overlapping solar collectors 400 to each other.

In another embodiment of solar collector 400, attachment component 440 is replaced with an attachment component 460. Attachment component 460 includes a first portion 462 to receive light directing component 410, buffer component 420 and propagation component 430 of solar collector 400, the optical component, and a second portion 464 to receive fastening components (not shown) to secure solar collector 400 to roof 422. Portion 462 of attachment component 460 is recessed relative to portion 464 such that light directing component 410 is generally flush with portion 464 of attachment component 460. Lower portion 442 of buffer component 420 is secured to a top surface 466 of attachment component 460 with an adhesive.

In one variation of solar collector 400, attachment component 440 or attachment component 460 are colored to given the appearance of traditional shingles or other roofing or building materials such that the roof appears aesthetically the same as a traditional roof. Further, a top surface 468 of solar collector 400 includes indicia (not shown) to give the appearance of the tabs of traditional shingles.

In another variation of solar collector 400, solar collector 400 is made from one or more flexible materials. As such, solar collector 400 is capable of being distributed as a roll of material that is applied to roof 422 by unrolling the roll on roof 422 to extend along an extent of roof 422, as a first row of "solar sheeting". The first row of "solar sheeting" is attached to roof 422 with fastening components. Solar collector 400 is then cut to length such that at least one of the ends of solar collector 400 includes a first surface 432 of propagation component 430. An output component 340 (as shown in FIG. 6A), such as energy converting component 342, another solar collector (not shown), or optical transport components 445a and 445b, is then coupled to the end of solar collector 400 including first surface 432. Next, a second row of "solar sheeting" are positioned by unrolling the remaining roll of solar collector 400 such that a portion of the second row overlays the first row and repeating the steps of fastening, trimming and coupling the second row. This operation is repeated for subsequent rows of "solar sheeting".

Figure 14:
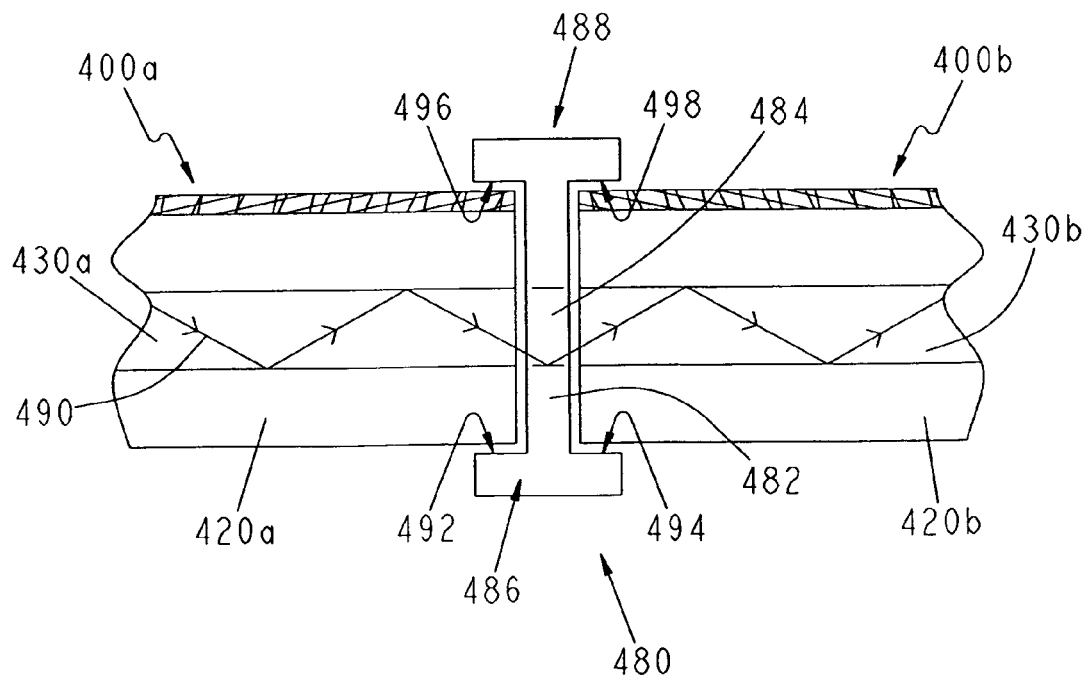
FIG. 14 is a cross-section view of an optical transport component for connecting two solar collectors.

In some instances, a row of "solar sheeting" is comprised of two separate sections of solar collectors, such as pieces from two rolls of solar collectors. The two sections of solar collectors may be coupled together by trimming the adjacent ends of each solar collector and either coupling the two sections together with an optical adhesive or coupling each end of the adjacent ends to an intermediate optical coupler, such as an optical transport component. As shown in FIG. 14, two sections of solar collector 400, sections 400a and 400b, are corrected together with an optical transport component 480. Sections 400a and 400b, each include a respective propagation component 430a and 430b and a respective buffer component 420a and 420b. Optical transport component 480 includes a buffer component 482 and a propagation component 484 which is configured to receive light ray 490 from propagation component 430a into propagation component 484 and to supply the solar radiation to propagation component 430b in solar collector 400b. In one example an optical adhesive is positioned between solar collector 400a and optical transport component 480 and between solar collector 400b and optical transport 480 to couple solar collector 400a and 400b to optical transport 480. In another example, optical transport 480 includes detents (not shown) on surfaces 492 and 494 of first elongated end 486 and on surfaces 496 and 498 of second elongated and 488. The detents are sized and configured to couple solar collectors 400a and 400b to optical transport 480.

Figure 10:
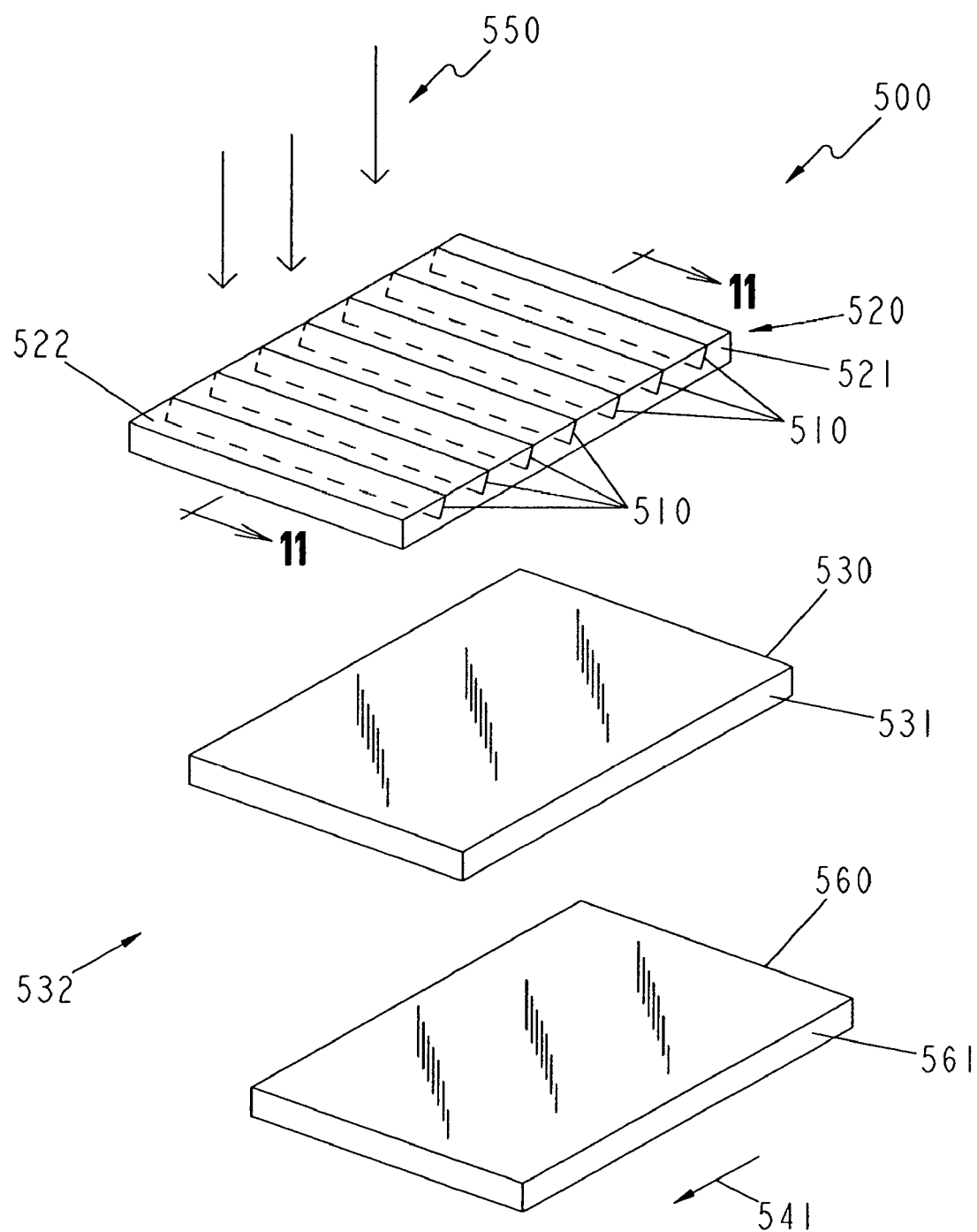
FIG. 10 is an exploded, perspective view of a solar collector including a plurality of radiation directing components positioned within a first buffer component, a propagation component, and a second buffer component.
Figure 11:
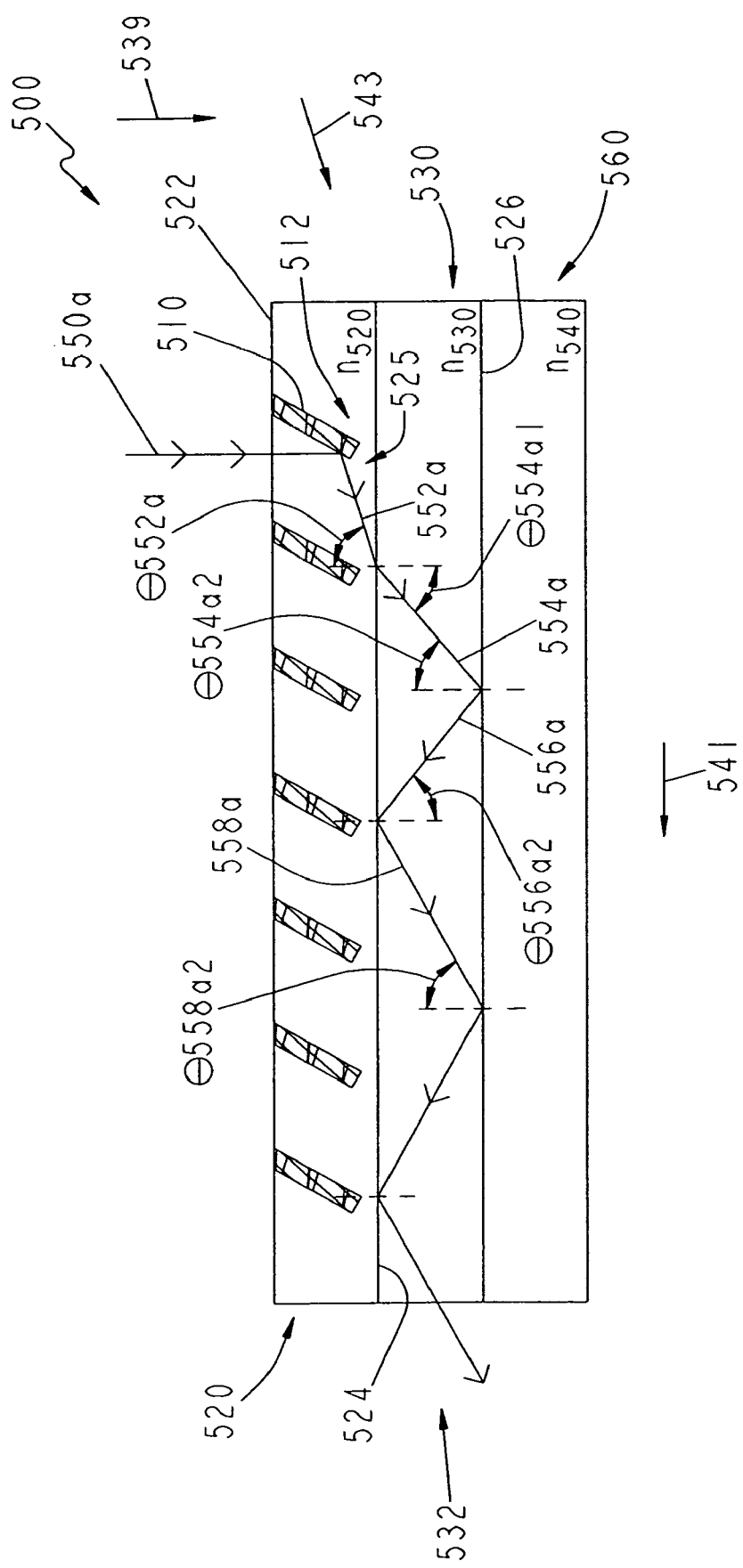
FIG. 11 is a cross-section view of the solar collector of FIG. 10 corresponding to the solar collector in an assembled configuration.

Referring to FIGS. 10 and 11, a solar collector 500 is shown. Solar collector 500 includes a plurality of light directing components 510, a first buffer component 520, a propagation component 530, and a second buffer component 540. Light directing components 510 are positioned within first buffer component 520 and oriented at an angle to top surface 522 of first buffer component 520. A lower portion 512 of light directing components 510 is spaced apart from a lower portion 525 of first buffer component 520 such that light directing components 510 do not touch propagation component 530. In an alternate embodiment solar collector 500 is similar to solar collector 100 and does not include a second buffer component 560.

Solar collector 500 operates in a similar manner to solar collectors 100, 200, 300, and 400 of the present invention. Solar radiation, as represented by light ray 550, enters first buffer component 520 from at least a first direction 539 through top surface 522 and is redirected by light directing component 510 along at least a second direction 543 as light ray 552a. Light ray 552a is incident on interface 524 between first buffer component 520 and propagation component 530 at an angle $\theta_{552a}$ and is refracted into propagation component 530 at an angle $\theta_{554a1}$. Light ray 554a propagates through propagation component 530 and strikes second buffer component 560 at an angle $\theta_{554a2}$ at interface 526. The refractive indexes of first buffer component 520, propagation component 530, and second buffer component 560 as well as the angle of light ray 552a directed by light directing component 510 are chosen such that angle $\theta_{554a2}$ and subsequent angles ($\theta_{556a2}$, $\theta_{558a2}$ . . . ) satisfy the requirements generally expressed in equations 3 and 4, thereby retaining light rays 554a, 556a, 558a and subsequent rays within propagation component 530 by total internal reflection and propagated generally in direction 541 toward first end 532. Alternatively interface 526 includes a reflection coating to reflect light rays 554a and 554b into propagation component 530. In yet further alternative embodiments, surfaces 521, 531, 561 of first buffer component 520, propagation component 530, and second buffer component 560, respectively, include a reflection coating.

In the illustrated embodiment, light directing components 510 are shown generally planar. In alternative embodiments the light directing components are concave in shape. The concave shape of the light directing components provides an additional mechanism by which incident solar radiation from multiple directions can be coupled into the propagation component by the light directing components.

Figure 12A:
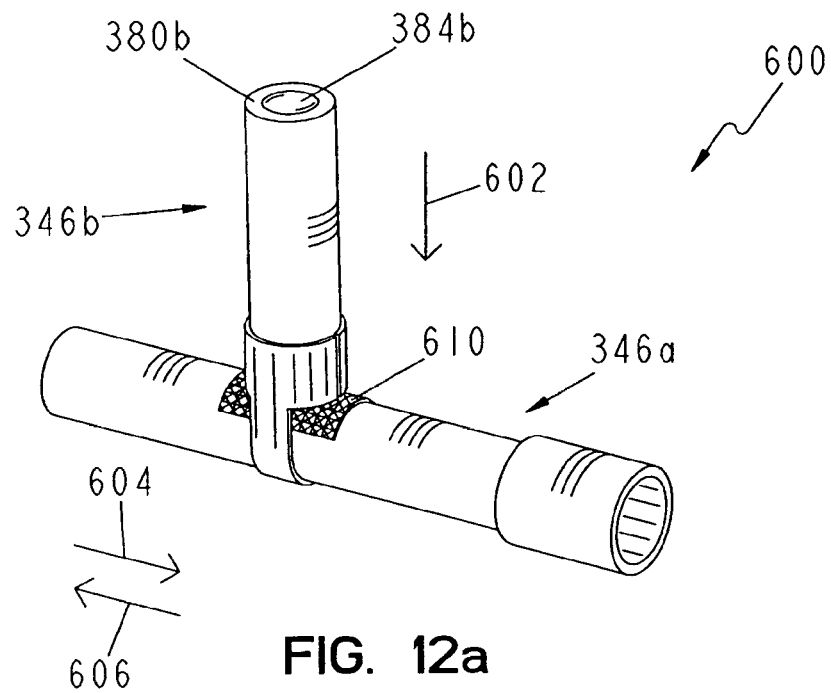
FIG. 12A is a perspective view of an exemplary optical connector in an assembled configuration.
Figure 12B:
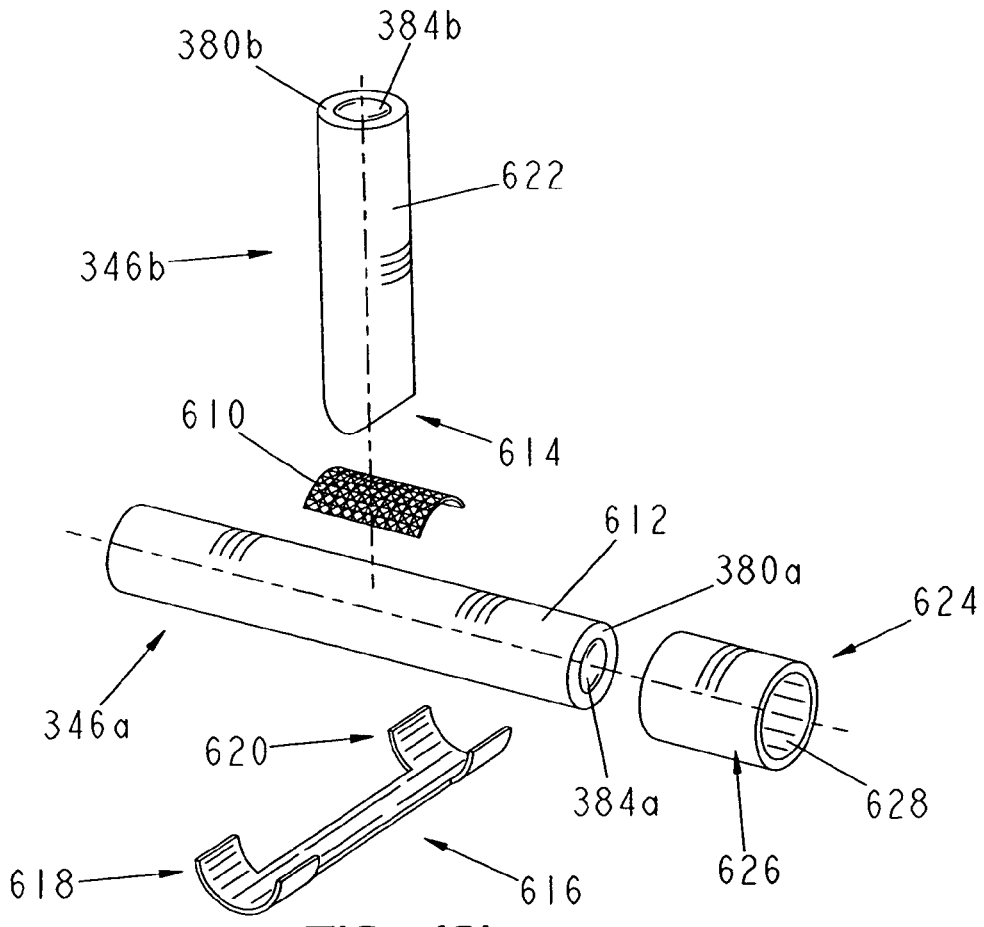
FIG. 12B is an exploded, perspective view of the optical connector of FIG. 12A.

Referring to FIGS. 12a and 12b multiple optical transport components 346, such as optical transport components 346a and 346b may be coupled together to form an optical connector 600. Optical transport components 346a and 346b each include a respective propagation component 384a and 384b and buffer components 380a and 380b. Optical connector 600 is shown as a T-connector, however, optical transport components 346a and 346b may be coupled at a variety of angles. Optical connector 600 is configured to couple radiation propagating within propagation component 384b of optical transport component 384b generally in direction 602 into propagation component 384a of optical transport component 346a such that the coupled radiation is retained within propagation component 384a and is propagated generally in direction 604 or in direction 606 or in both direction 604 and direction 606 depending on the characteristics of light directing component 610.

Referring to FIG. 12b, light directing component 610 is coupled to, formed on, or otherwise positioned on surface 612 of optical transport component 346a. Light directing component 610 is further coupled to, or formed on, or positioned adjacent to a first end 614 of optical transport component 346b. First end 614 is shown as being configured to match the contour of surface 612 of optical transport component 346a. However, first end 614 maybe flat, concave, convex, or additional configurations. In one example, light directing component 610 includes a holographic element and is coupled to surface 612 of optical transport component 346a and first end 614 of optical transport component 346b with an optical adhesive. In another example, optical transport component 346a, optical transport component 346b and light directing component 610 are formed as an integral optical connector.

In a further example of optical connector 600, optical transport component 346a and optical transport component 346b are further secured to light directing component 610 with a coupler 616. Coupler 616 includes a first portion 618 and a second portion 620 which are configured to wrap around surface 612 of optical transport component 346a and to be adhered to a surface 622 of optical transport component 346b.

As shown in FIG. 12b, an additional coupler 624 is shown. Coupler 624 includes a cylindrical body 626 having an interior surface 628 sized to receive surface 612 of optical transport component 346a and a similar surface of an additional optical transport component (not shown). Optical transport component 346a may be secured to coupler 624 and the adjacent optical transport component (not shown) with a suitable optical adhesive.

In yet another example of optical connector 600, optical transport component 346a and optical transport component 346b are secured to a fixture or frame (not shown) and are positioned such that first end 614 of optical transport component 346b is positioned proximate to surface 612 of optical transport component 346a. Further, light directing component 610 is either positioned in the space between optical transport component 346a and optical transport component 346b, formed on first end 614 of optical transport component 346b, formed on surface 612 of optical transport component 346a, coupled to first end 614 of optical transport component 346b, or coupled to surface 612 of optical transport component 346a.

It is possible, therefore with optical connectors 600, to have a plurality of optical transport components 346, such as optical transport component 346b, each having a first end 614 positioned generally radially to a main optical transport component 346, such as optical transport component 346a. Each of the radially placed optical transport components 346b are optically coupled to main optical transport component 346a through a light directing component, such as light directing component 610.

Figure 13:
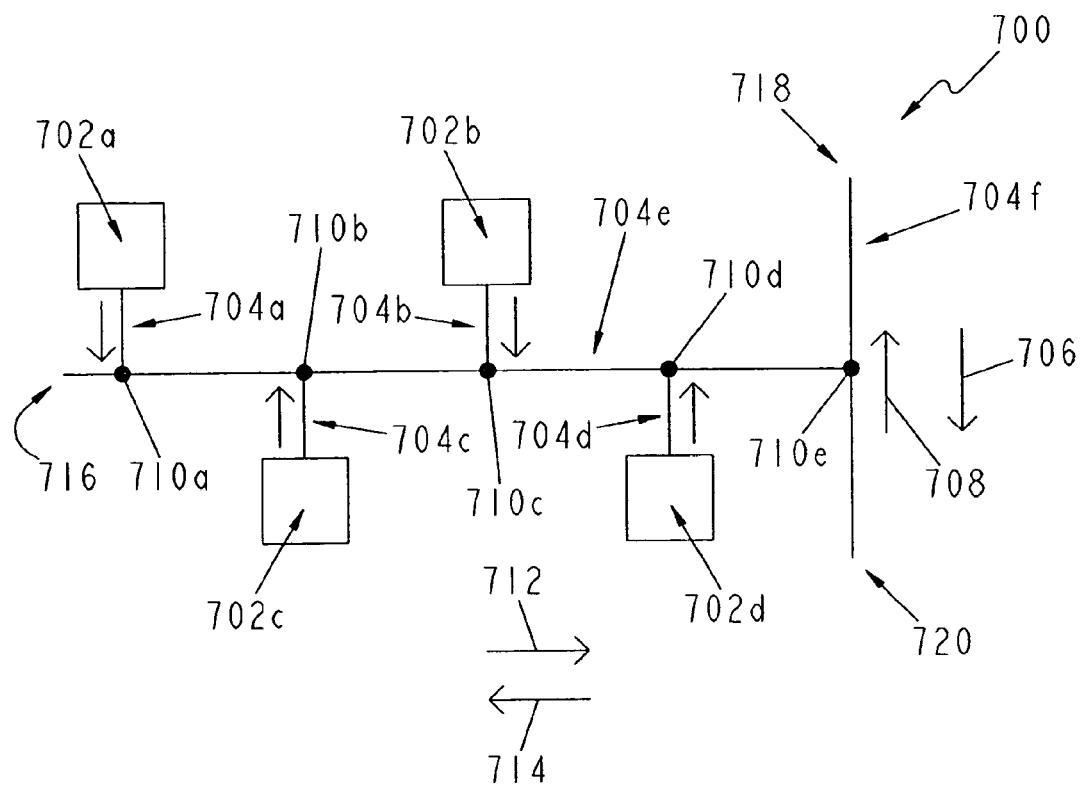
FIG. 13 is a diagrammatic view of an optical network.

As such with optical connectors 600 it is possible to create a network of optical transport components 346. Referring to FIG. 13, an optical network 700 is shown. Optical network 700 includes plurality of solar collectors 702a–d, each configured to collect incident radiation and to couple the collected radiation into an optical transport component, such as optical transport components 704a–d. Each optical transport component 704a–d is configured to transport the collected radiation. As shown in FIG. 13, optical transport component 704a and 704b transport the radiation collected by solar collectors 702a and 702b, respectively, generally in a direction 706 while optical transport component 704c and 704d transport the radiation collected by solar collectors 702c and 702d, respectively, generally in a direction 708.

Optical transport components 704a–d, each is coupled to a main optical transport component 704e at connections 710a–d. Connections 710a–d are configured to couple the radiation transported by optical transport component 704a–d into optical transport component 704e such that the radiation is propagated within optical transport component 704e in either direction 712 or direction 714 or in both direction 712 and direction 714. Each of connections 710a–d includes a light directing component (not shown) whose characteristics determines the direction of travel of the radiation from the corresponding optical transport component 704a–d within optical transport component 704e, either direction 712, direction 714 or a combination of direction 712 and 714. In one example, connections 710a–d include optical connectors 600 similar to the optical connectors illustrated in FIGS. 12A and 12B such that optical transport component 704e is comprised of several segments interconnected with optical connectors 600. In another example, connections 710a–d include optical connectors 600 as discussed above wherein optical transport component 704e is a main optical transport component and optical transport components 704a–d are radially positioned optical transport components.

Once the radiation transported by optical transport components 704a–d is coupled into optical transport component 704e, it is delivered either to another connection, such as connection 710e or to an end 716 of optical transport component 704e. As illustrated in FIG. 13 connection 710e couples the radiation propagating in optical transport component 704e in direction 712 into an optical transport component 704f. The radiation coupled into optical transport component 704f is either propagated generally in direction 706, generally in direction 708, or in generally in both directions 706 and 708 depending on the characteristics of the light directing component corresponding to connection 710e. The radiation coupled into optical transport component 704f is propagated to either a first end 718 or a second end 720 of optical transport component 704f. The radiation propagated to end 716 of optical transport component 704e or first end 718 or second end 720 of optical transport component 704f is then supplied to an output component, such as output component 340 or for lighting applications.

Optical network 700 is shown in FIG. 13 for use in the collection of solar radiation. However, it should be understood that additional types of optical networks are envisioned. For instance, optical connectors 600 can be configured to couple multiple optical fibers together in an optical network. As such, optical connectors 600 are capable of use to couple optical signals, such as data signals, from a first fiber optic cable, such as optical transport component 346b, into a second fiber optic cable, such as optical transport component 346a.

In one example, light directing component 610 is configured to redirect radiation propagating in optical transport component 346b having a first wavelength, such as 632.8 nanometers, generally along direction 604 in optical transport component 346a and radiation of a second wavelength different than 632.8 nanometers generally along direction 606 in optical transport component 346a. As such, based on the wavelength of radiation propagating within optical transport component 346b light directing component 610 acts as an optical switch to send radiation of a first wavelength along first direction 604 of optical transport component 346a or a first optical circuit and radiation of a second wavelength along second direction 606 of optical transport component 346a or a second optical circuit. Further, if radiation containing both the first and the second wavelengths is propagating within optical transport component 346b as first and second data signals, light directing component 610 acts as an optical separator or filter by sending radiation of a first wavelength, the first data signal, along first direction 604 of optical transport component 346a and radiation of a second wavelength, the second data signal, along second direction 606 of optical transport component 346a. Although the above example discusses the use of optical connector 600 as an optical switch or optical separator for two distinct wavelengths, it is contemplated that optical connector 600 can be used as an optical connector, an optical switch, or an optical separator for one, two, three or more distinct wavelengths.

In another example, optical transport component 346b is replaced with an optical source, such as a laser, a laser diode, a light-emitting diode, photochemical radiation sources such as a phosphorescence or fluorescence material, or other radiation producing component. As such, the radiation produced by the optical source is coupled into optical transport component 346a through light directing component 610.

Although the invention has been described in detail with reference to certain illustrated embodiments, variations and modifications exist within the scope and spirit of the present invention as described and defined in the following claims.

We claim:

1. A method of collecting incident radiation, the method comprising:
   receiving the incident radiation from at least a first direction;
   redirecting the incident radiation with a radiation directing component into a propagation component, the radiation directing component being coupled to a buffer component configured to optically separate radiation directing component and propagation component and to retain the incident radiation in the propagation component;
   retaining the radiation in the propagation component such that the radiation is propagated generally toward a first end of the propagation component; and
   optically separating the radiation component from the propagation component such that the radiation propagating with the propagation component is prevented from interacting with the radiation directing component.

2. The method of claim 1, wherein the radiation is retained within the propagation component by at least total internal reflection.

3. The method of claim 2, wherein the propagation component includes a reflection coating on at least a first surface and the radiation is retained within the propagation component by at least reflection from the reflection coating.

4. The method of claim 1, further comprising coupling the radiation propagated toward the first end of the propagation component to an output component, the output component selected from the group consisting of an energy converting component, a collector, and an optical transport component.

5. A method of coupling optical radiation from at least a first source of optical radiation into a first optical transport component including a first propagation component and a first buffer component, the first buffer component radially overlaying the first propagation component and the first optical transport component configured to propagate optical radiation in generally a first direction toward a first end of the first optical transport component or in generally a second direction toward a second end of the first optical transport component, the method comprising:
   positioning the at least first source of optical radiation adjacent an exterior radial surface of the first buffer component; and
   directing at least a portion of the radiation emanating from the source of optical radiation into the first buffer component of the first optical transport component such that the radiation is coupled into the first propagation component and is propagated within the first propagation component toward at least one of the first end or the second end of the first propagation component due at least to total internal reflection between the first propagation component and the second component.

6. The method of claim 5, wherein the source of optical radiation is selected from the group consisting of a laser, a laser diode, a light emitting diode, or a second optical transport component.

7. The method of claim 5, wherein the optical radiation is directed toward the first end of the first propagation component due to the optical radiation having a wavelength corresponding to a first wavelength.

8. The method of claim 7, wherein the optical radiation is directed toward the second end of the first propagation component due to the optical radiation having a wavelength corresponding to a second wavelength.

9. An optical connector for transferring radiation, the optical connector comprising:
   a first optical transport component including a first propagation component and a first buffer component, the first buffer component radially overlaying the first propagation component, the first optical transport component configured to propagate optical radiation in generally a first direction toward a first end of the first optical transport component;
   a second optical transport component including a second propagation component and a second buffer component, the second buffer component radially overlaying the second propagation component, the second optical transport component configured to propagate optical radiation in generally a second direction toward a second end of the second optical transport component, the second optical transport component being positioned such that the second direction is not parallel to the first direction; and a radiation directing component located proximate to the first end of the first optical transport component and proximate to an exterior surface of the buffer component of the second optical transport component, the radiation directing component configured to redirect the optical radiation propagating generally in the first direction through the exterior surface of the second optical transport into the second propagation component such that the optical radiation is propagated within second optical transport component generally along the second direction of the second optical transport component.

10. The optical connector of claim 9, wherein the radiation directing component is coupled to the exterior surface of the second buffer component.

11. The optical connector of claim 10, wherein the radiation directing component includes a holographic element.

12. The optical connector of claim 10, wherein the radiation directing component includes a diffraction grating.

13. The optical connector of claim 9, wherein the radiation directing component is configured to redirect the optical radiation such that the optical radiation will propagate within the second optical transport component in the second direction when a wavelength of the optical radiation is a first wavelength and is further configured to redirect the optical radiation such that the optical radiation will propagate within the second optical transport component in a third direction generally opposite to the second direction when the wavelength of the optical radiation is a second wavelength different than the first wavelength.

14. The optical connector of claim 10, wherein the optical radiation coupled from the first optical transport component into the second optical transport component includes a data signal.

* * * * *